(12) United States Patent
Hatanaka

(10) Patent No.: US 8,828,651 B2
(45) Date of Patent: Sep. 9, 2014

(54) POSITIVE-TYPE PHOTOSENSITIVE RESIN COMPOSITION AND CURED FILM MANUFACTURED THEREFROM

(75) Inventor: Tadashi Hatanaka, Toyama (JP)

(73) Assignee: Nissan Chemical Industries, Ltd., Tokyo (JP)

(*) Notice: Subject to any disclaimer, the term of this patent is extended or adjusted under 35 U.S.C. 154(b) by 876 days.

(21) Appl. No.: 11/491,156

(22) Filed: Jul. 24, 2006

(65) Prior Publication Data

US 2007/0020559 A1    Jan. 25, 2007

(30) Foreign Application Priority Data

| Jul. 25, 2005 | (JP) | ................................ 2005-214589 |
| Dec. 19, 2005 | (JP) | ................................ 2005-364886 |
| Jan. 18, 2006 | (JP) | ................................ 2006-010383 |
| May 26, 2006 | (JP) | ................................ 2006-146893 |

(51) Int. Cl.
G03F 7/039  (2006.01)
G03F 7/027  (2006.01)
G03F 7/26   (2006.01)
G03F 7/16   (2006.01)
G03F 7/20   (2006.01)

(52) U.S. Cl.
CPC ............... *G03F 7/168* (2013.01); *G03F 7/027* (2013.01); *G03F 7/2004* (2013.01); *G03F 7/0392* (2013.01); *Y10S 430/128* (2013.01)
USPC ...................... 430/326; 430/270.1; 430/281.1; 430/927

(58) Field of Classification Search
USPC ............. 430/270.1, 288.1, 284, 281.1, 286.1, 430/287.1, 326, 927
See application file for complete search history.

(56) References Cited

U.S. PATENT DOCUMENTS

| 4,456,679 | A | * | 6/1984 | Leyrer et al. ................... 430/326 |
| 5,075,199 | A | | 12/1991 | Schwalm et al. |
| 5,882,844 | A | | 3/1999 | Tsuchiya et al. |
| 6,245,485 | B1 | * | 6/2001 | Aoai et al. .................. 430/288.1 |
| 6,465,148 | B1 | * | 10/2002 | Kang et al. .................. 430/270.1 |
| 6,613,844 | B2 | * | 9/2003 | Watanabe et al. ............. 525/241 |
| 6,783,911 | B2 | * | 8/2004 | Mulligan ...................... 430/165 |
| 7,001,705 | B2 | | 2/2006 | Hatanaka et al. |
| 7,316,884 | B2 | * | 1/2008 | Ansai et al. .................. 430/270.1 |
| 7,824,837 | B2 | * | 11/2010 | Wu et al. .................. 430/270.1 |
| 8,168,371 | B2 | * | 5/2012 | Hatanaka .................. 430/288.1 |
| 2001/0036591 | A1 | * | 11/2001 | Schulz et al. ............. 430/270.1 |
| 2002/0020832 | A1 | * | 2/2002 | Oka et al. ....................... 252/500 |
| 2002/0098443 | A1 | * | 7/2002 | Hatakeyama et al. ..... 430/270.1 |
| 2004/0009363 | A1 | * | 1/2004 | Shouldice et al. ............. 428/523 |
| 2005/0191580 | A1 | * | 9/2005 | Takahashi et al. ......... 430/270.1 |
| 2006/0210915 | A1 | * | 9/2006 | Takei et al. ................. 430/270.1 |
| 2006/0211797 | A1 | | 9/2006 | Tsuji et al. |
| 2007/0020559 | A1 | | 1/2007 | Hatanaka |
| 2008/0044764 | A1 | | 2/2008 | Takahashi et al. |
| 2010/0028805 | A1 | | 2/2010 | Hatanaka |

FOREIGN PATENT DOCUMENTS

| JP | A-4-211255 | | 8/1992 |
| JP | A-9-274319 | | 10/1997 |
| JP | A-10-197715 | | 7/1998 |
| JP | A-10-206627 | | 8/1998 |
| JP | A-11-54270 | | 2/1999 |
| JP | A-11-326625 | | 11/1999 |
| JP | A-2000-187111 | | 7/2000 |
| JP | A-2000-353594 | | 12/2000 |
| JP | A-2001-27804 | | 1/2001 |
| JP | 2005134440 A | * | 5/2005 |
| JP | A-2005-181976 | | 7/2005 |
| JP | A-2005-300759 | | 10/2005 |
| WO | WO 2005/052688 A2 | | 6/2005 |
| WO | WO 2005/116764 A1 | | 12/2005 |
| WO | WO 2007/086249 A1 | | 8/2007 |
| WO | WO 2007/132890 A1 | | 11/2007 |
| WO | WO 2007/132892 A1 | | 11/2007 |
| WO | WO 2007/145249 A1 | | 12/2007 |
| WO | WO 2008/029706 A1 | | 3/2008 |
| WO | WO 2008/035672 A1 | | 3/2008 |

OTHER PUBLICATIONS

Feb. 12, 2008 International Search Report issued in International Application No. PCT/JP2008/050644.

\* cited by examiner

*Primary Examiner* — Anca Eoff

(74) *Attorney, Agent, or Firm* — Oliff PLC

(57) ABSTRACT

A positive-type photosensitive resin composition comprising component (A): an alkali-soluble resin having a functional group which undergoes heat crosslinking reaction with a compound of component (B), a functional group for film curing which undergoes thermoset reaction with a compound of component (C), and a number average molecular weight of 2,000 to 30,000;

component (B): a compound having two or more vinyl ether groups per molecule;

component (C): a compound having two or more blocked isocyanate groups per molecule;

component (D): a photoacid generator; and component (E): a solvent. A production process of the positive-type photosensitive resin composition comprising mixing the above-mentioned components and maintaining the mixture at a temperature higher than room temperature. A cured film manufactured by using the positive-type photosensitive resin composition. The composition has a high sensitivity and little film reduction of unexposed part, maintains a high transmittance even after baking at a high temperature or resist stripping treatment, and cause no reduction of film thickness. Therefore, the composition provides a cured film suited as a film material for several displays.

21 Claims, 1 Drawing Sheet

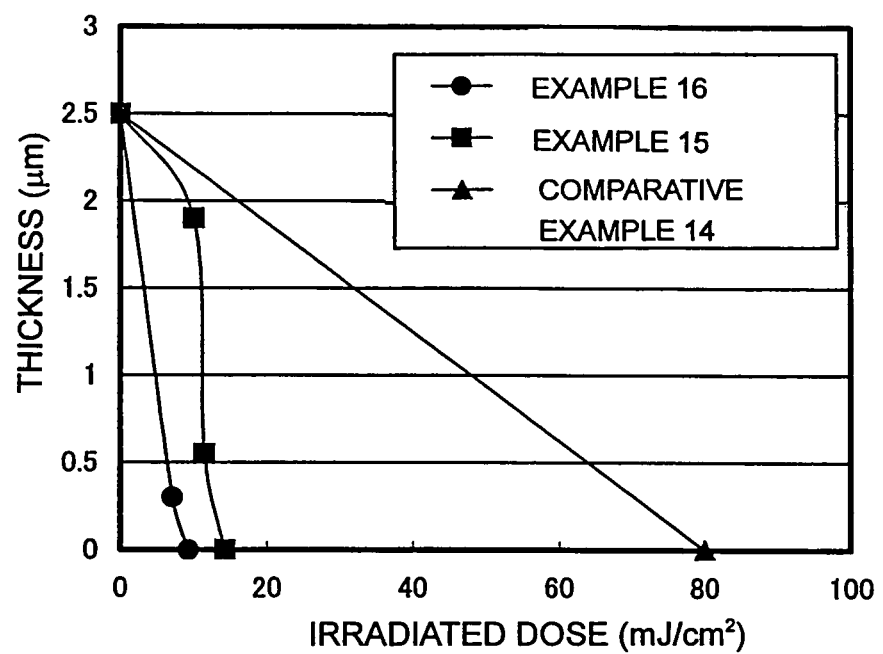

POSITIVE-TYPE PHOTOSENSITIVE RESIN COMPOSITION AND CURED FILM MANUFACTURED THEREFROM

BACKGROUND OF THE INVENTION

I. Field of the Invention

The present invention relates to a positive-type photosensitive resin composition and a production process thereof, a method for forming a pattern by use of the resin composition, and a cured film manufactured from the resin composition. More specifically, the present invention relates to a positive-type photosensitive resin composition suitable for the purpose of display materials and a production process thereof, a method for forming a pattern by use of the resin composition, a cured film manufactured from the resin composition, and several materials by use of the cured film.

II. Description of the Related Art

Generally, in display devices such as thin film transistor (TFT) type liquid crystal displays, organic electroluminescent (EL) devices, or the like, electrode protection films, flattening films, insulating films or the like that are pattern-formed is provided. The materials for forming these films are photosensitive resin compositions that have been widely used until now and that among photosensitive resin compositions, have characteristics which the number of steps for obtaining required pattern form is small and the compositions have fully high flattening property.

And, these films are required to be excellent in process resistances such as heat resistance, solvent resistance, long-term baking resistance or the like, to have good adhesion with an under layer, to have a wide process margin so as to form a pattern under several process conditions suited for use purpose, and to have a high sensitivity, a high transparency and little unevenness of film after development. From the viewpoint of the above-mentioned required characteristics, resins containing a naphthoquinone diazide compound have been widely used for the photosensitive resin compositions.

On the other hand, among the characteristics required for the photosensitive resin compositions, one of the most important characteristics is sensitivity. The improvement of sensitivity makes possible to significantly reduce production time in industrial production of display devices and the like. Therefore, in the present status that the amount demanded for liquid crystal displays is remarkably increased, sensitivity is one of the most important characteristics required for this sort of photosensitive resin compositions.

However, the above-mentioned conventional photosensitive resin compositions containing a naphthoquinone diazide compound was not fully satisfactory in sensitivity. Although sensitivity is increased by increasing the solubility of polymers in the compositions in an alkaline developer, this process has a limit, and has disadvantages that dissolution of unexposed part also occurs and thus residual film rate is lowered to cause unevenness of film for substrates for large displays.

Therefore, there are some patent applications that are designed to increase sensitivity of photosensitive resin compositions. For example, a radiation-sensitive resin composition containing an alkali-soluble resin and at least one of specific polyhydroxy compounds and derivatives thereof is proposed (for example, see JP-A 4-211255 (1992)). However, the proposed composition had problems in shelf stability owing to a high symmetry of the photosensitizing agent.

In addition, a positive-type radiation-sensitive resin composition containing an alkali-soluble phenol resin and a radiation sensitive compound (for example, see JP-A 9-006000 (1997)), and a positive-type photosensitive resin composition containing a specific alkali-soluble resin and a quinone diazide compound (for example, see JP-A 8-044053 (1996)) are proposed. However, because these compositions use a novolak resin as a binder polymer, they had problems in transparency and stability on long-term baking.

As mentioned above, it was very difficult to develop a photosensitive resin composition having a high sensitivity of a desired level while fulfilling other characteristics, and it was also difficult to obtain a sufficient photosensitive resin composition by mere combinations of the prior arts.

Generally, in case where the conventional photosensitive resin compositions containing a naphthoquinone diazide compound is used, photo-bleaching is carried out in order to prevent coloring of cured film due to naphthoquinone diazide compound after exposure to light and development and lowering of transparency. However, even in case where the photo-bleaching process is carried out, when the resulting film is baked at a high temperature of about 250° C., light transmittance is lowered to cause coloring. On the other hand, even when it is baked at a lower temperature for example 230° C. for a long time, a lowering of light transmittance (coloring) occurs. Further, there occur problems that transmittance is lowered to deteriorate transparency also by a chemical treatment with an agent such as an amine solution being a resist stripping liquid. The conventional photosensitive resin compositions containing a naphthoquinone diazide compound had problems in heat resistance and chemical resistance as mentioned above (for example, see JP-A 4-352101 (1992)).

On the other hand, conventionally chemically-amplified type resists have been developed as photosensitive material with a high sensitivity and a high resolution. The conventional chemically-amplified type resists that have been developed as resists for semiconductors can be applied for also a light source (KrF, ArF) having a wavelength shorter than i-line, and thus can form a finer pattern. However, the protective group-binding part and the ether bond of heat-crosslinking part of such resists easily decompose at a high temperature used in film cure or in the presence of resist stripping liquid, and thus heat resistance and chemical resistance are remarkably lowered, and therefore it was almost impossible to utilize them as permanent film (for example, see U.S. Pat. No. 5,075,199 (1991)). Further, in order to make heat curing possible, when crosslinking agents such as epoxy compounds or aminoplasts are introduced in chemically-amplified type resists, there occur problems that crosslink of exposed parts proceeds by the effect of the acid generated from photoacid generator (PAG) in the resists by exposure to light, and dissolution contrast with unexposed part distinguishes. Therefore, it is difficult to introduce the above-mentioned crosslinking agents in the chemically-amplified type resists.

SUMMARY OF THE INVENTION

The present invention was made in consideration of the above-mentioned situation. An object of the present invention is to provide a positive-type photosensitive resin composition that has a fully high sensitivity and little film reduction of unexposed part on development, and further maintain a high transmittance even when it is baked at a high temperature after forming film, and cause little reduction of film thickness or little lowering of transmittance even when it is subjected to resist stripping liquid (amine solution) treatment. In addition, another object of the present invention is to provide a method for forming pattern by use of the positive-type photosensitive resin composition, particularly a method for forming pattern excellent in resolution. Further, an object of the present invention is to provide a process for producing the positive-type photosensitive resin composition having the above-mentioned characteristics.

In addition, an object of the present invention is to provide a cured film produced by use of the positive-type photosensitive resin composition that cause no lowering of transmittance even with baking at a high temperature or resist stripping liquid (amine solution) treatment and maintain a high transparency, and thus is excellent in heat resistance and chemical resistance. Further, another object of the present invention is to provide several devices and materials manufactured by use of the cured film.

The eager investigation by the present inventors for solving the problems led to the finding of the present invention. That is, the present invention includes the following aspects:

as a first aspect, a positive-type photosensitive resin composition comprising the following component (A), component (B), component (C), component (D) and component (E):

component (A): an alkali-soluble resin having a functional group which undergoes heat crosslinking reaction with a compound of component (B), a functional group for film curing which undergoes thermoset reaction with a compound of component (C), and a number average molecular weight of 2,000 to 30,000;

component (B): a compound having two or more vinyl ether groups per molecule;

component (C): a compound having two or more blocked isocyanate groups per molecule;

component (D): a photoacid generator; and component (E): a solvent;

as a second aspect, the positive-type photosensitive resin composition as set forth in the first aspect, wherein the functional group for heat crosslinking reaction is at least one selected from the group consisting of carboxyl groups and phenolic hydroxy groups, and the functional group for film curing is at least one selected from the group consisting of hydroxy groups other than phenolic hydroxy groups, and amino groups having an active hydrogen;

as a third aspect, the positive-type photosensitive resin composition as set forth in the first aspect, further comprising as component (F), other alkali-soluble resin other than component (A);

as a fourth aspect, the positive-type photosensitive resin composition as set forth in the first or second aspect, containing 1 to 80 mass parts of component (B), 1 to 80 mass parts of component (C), and 0.5 to 80 mass parts of component (D), based on 100 mass parts of component (A);

as a fifth aspect, the positive-type photosensitive resin composition as set forth in the fourth aspect, further comprising as component (G), an amine compound in an amount of 0.001 to 5 mass parts based on 100 mass parts of component (A);

as a sixth aspect, the positive-type photosensitive resin composition as set forth in the fifth aspect, further comprising as component (F), other alkali-soluble resin other than component (A);

as a seventh aspect, the positive-type photosensitive resin composition as set forth in any one of the first to third aspects, further comprising as component (H), a surfactant in an amount of 0.2 mass % or less in the positive-type photosensitive resin composition;

as an eighth aspect, the positive-type photosensitive resin composition as set forth in the fifth aspects, further comprising as component (H), a surfactant in an amount of 0.2 mass % or less in the positive-type photosensitive resin composition;

as a ninth aspect, a method for forming pattern comprising the steps:

coating the positive-type photosensitive resin composition as set forth in any one of the first to eighth aspects on a substrate, irradiating the coated surface with UV light through a pattern mask, forming a pattern on the substrate by developing the coated surface, and post-baking for film curing to the pattern-formed surface;

as a tenth aspect, the method for forming pattern as set forth in the ninth aspect, wherein the UV light is light having at least one wavelength of i-line, g-line and h-line;

as an eleventh aspect, the method for forming pattern as set forth in the ninth aspect, wherein the UV light is ArF, KrF or $F_2$ laser light;

as a twelfth aspect, a production process of positive-type photosensitive resin composition comprising the following component (A), component (B), component (C), component (D) and component (E):

component (A): an alkali-soluble resin having a functional group which undergoes heat crosslinking reaction with a compound of component (B), a functional group for film curing which undergoes thermoset reaction with a compound of component (C), and a number average molecular weight of 2,000 to 30,000;

component (B): a compound having two or more vinyl ether groups per molecule;

component (C): a compound having two or more blocked isocyanate groups per molecule;

component (D): a photoacid generator; and component (E): a solvent, characterized by comprising the steps:

mixing component (A), component (B), component (C), component (D) and component (E) to obtain a mixture solution, advancing the crosslinking reaction to an extent by maintaining the mixture solution at a temperature higher than room temperature for a predetermined time to produce a positive-type photosensitive resin composition containing a crosslinked product of component (A) and component (B) in addition to components (A), (B), (C) and (D);

as a thirteenth aspect, the production process of positive-type photosensitive resin composition as set forth in the twelfth aspect, wherein the mixture solution is maintained at a temperature of 30 to 70° C. for 2 hours to 5 days;

as a fourteenth aspect, the production process of positive-type photosensitive resin composition as set forth in the twelfth or thirteenth aspect, wherein the functional group for heat crosslinking reaction is at least one selected from the group consisting of carboxyl groups and phenolic hydroxy groups, and the functional group for film curing is at least one selected from the group consisting of hydroxy groups other than phenolic hydroxy groups, and amino groups having an active hydrogen;

as a fifteenth aspect, the production process of positive-type photosensitive resin composition as set forth in the twelfth aspect, further comprising as component (F), other alkali-soluble resin other than component (A);

as a sixteenth aspect, the production process of positive-type photosensitive resin composition as set forth in the twelfth or thirteenth aspect, containing 1 to 80 mass parts of component (B), 1 to 80 mass parts of component (C), and 0.5 to 80 mass parts of component (D), based on 100 mass parts of component (A);

as a seventeenth aspect, the production process of positive-type photosensitive resin composition as set forth in the sixteenth aspect, further comprising as component (G), an amine compound in an amount of 0.001 to 5 mass parts based on 100 mass parts of component (A);

as an eighteenth aspect, the production process of positive-type photosensitive resin composition as set forth in the seventeenth aspect, further comprising as component (F), other alkali-soluble resin other than component (A);

as a nineteenth aspect, the production process of positive-type photosensitive resin composition as set forth in any one of the twelfth, thirteenth or fifteenth aspect, further comprising as component (H), a surfactant in an amount of 0.2 mass % or less in the positive-type photosensitive resin composition;

as a twentieth aspect, the production process of positive-type photosensitive resin composition as set forth in the seventeenth aspect, further comprising as component (H), a surfactant in an amount of 0.2 mass % or less in the positive-type photosensitive resin composition;

as a twenty-first aspect, a cured film manufactured by using the positive-type photosensitive resin composition as set forth in any one of the first to eighth aspects or the positive-type photosensitive resin composition produced by the process as set forth in any one of the twelfth to twentieth aspects;

as a twenty-second aspect, a liquid crystal display device having the cured film as set forth in the twenty-first aspect;

as a twenty-third aspect, an array flattening film for liquid crystal display composed of the cured film as set forth in the twenty-first aspect;

as a twenty-fourth aspect, an interlayer insulating film composed of the cured film as set forth in the twenty-first aspect; and as a twenty-fifth aspect, a microlens composed of the cured film as set forth in the twenty-first aspect.

The present invention provides a positive-type photosensitive resin composition having a composition which is able to heat crosslink with a compound having a vinyl ether group, and to undergo thermoset reaction of film with a compound having a blocked isocyanate group, and therefore the present invention exerts effects that it has a fully high sensitivity and little film reduction of unexposed part on development, and further maintain a high transmittance even when it is baked at a high temperature such as 250° C. after forming film (or even when it is baked at 230° C. for a long time), and cause no reduction of film thickness or no lowering of transmittance even when it is subjected to resist stripping liquid (amine solution) treatment. In addition, when patter formation is carried out by use of the positive-type photosensitive resin composition according to the present invention, patterns with excellent resolution (fine pattern size) can be obtained.

In addition, the cured films produced by use of the positive-type photosensitive resin composition according to the present invention cause little lowering of transmittance even with baking at a high temperature (250° C.) or resist stripping liquid (amine solution) treatment and maintain a high transparency, and thus the cured films are excellent in heat resistance and chemical resistance. Therefore, the present invention exerts effects that it is suitable for the purpose of several film materials in liquid crystal or organic EL displays such as array flattening film of TFT type liquid crystal device for which chemically-amplified type resists have not be conventionally applied, and for the purpose of microlens, and the like.

The production process of the present invention can provide positive-type photosensitive resin compositions having a composition which is able to heat crosslink with a compound having a vinyl ether group, and to undergo thermoset reaction with a compound having a blocked isocyanate group, and containing a crosslinked product between an alkali-soluble resin and a compound having a vinyl ether group to some extent. The composition is improved in sensitivity compared with not only that by the prior method in which naphthoquinone diazide compound or the like is used, but also the positive-type photosensitive resin composition containing no the above-mentioned crosslinked product. Further, the compositions produced according to the present invention have little film reduction of unexposed part on development, and further maintain a high transmittance even when it is baked at a high temperature such as 250° C. after forming film (or even when it is baked at 230° C. for a long time), and cause little reduction of film thickness or little lowering of transmittance even when it is subjected to resist stripping liquid (amine solution) treatment.

The production process of the present invention makes possible to very advantageously produce the positive-type photosensitive resin compositions that can provide cured films suitable for the purpose of several film materials in liquid crystal or organic EL displays such as array flattening film of TFT type liquid crystal device for which chemically-amplified type resists have not be conventionally applied, and for the purpose of microlens, and the like.

BRIEF DESCRIPTION OF THE DRAWINGS

FIG. 1 is a graph showing film thickness ($\mu m$, film thickness remaining undissolved in exposed part) on the irradiated dose ($mJ/cm^2$).

DETAILED DESCRIPTION OF THE PREFERRED EMBODIMENTS

[Positive-Type Photosensitive Resin Composition]

The positive-type photosensitive resin composition of the present invention is a composition comprising an alkali-soluble resin of component (A), a compound having two or more vinyl ether groups of component (B), a compound having two or more blocked isocyanate groups of component (C), a photoacid generator of component (D) and component (E), and optionally other alkali-soluble resin of component (F), an amine compound of component (G) or a surfactant of component (H).

In addition, the positive-type photosensitive resin composition produced according to the process of the present invention contains in addition to crosslinked products between component (A) and component (B) as mentioned below, the above-mentioned components (A) to (E), and optionally components (F) to (H).

In the meantime, the proportion of components (A) and (B) is determined based on the added amount in mixing step. In case where heat crosslinking reaction progresses to an extent to form crosslinked products between component (A) and component (B) by maintaining at an elevated temperature after mixing, the added amount of component (A) is the sum of the amount of component (A) forming the crosslinked products with the amount of component (A) no participating in the crosslinking. Similarly, the added amount of component (B) is the sum of the amount of component (B) forming the crosslinked products with the amount of component (B) no participating in the crosslinking.

Hereinafter, each component is described in detail.

<Component (A)>

Component (A) is an alkali-soluble resin having a functional group which undergoes heat crosslinking reaction with a compound having vinyl ether groups of component (B), a functional group for film curing which undergoes thermoset reaction with a compound having blocked isocyanate groups of component (C), and a number average molecular weight in term of polystyrene (hereinafter, referred to as number average molecular weight) of 2,000 to 30,000.

The functional group for heat crosslinking reaction forms crosslink with the compound of component (B) by reacting with vinyl ether groups on the compound of component (B) at an elevated temperature and is able to form a resist film. The representative functional group thereof is at least one selected from the group consisting of carboxyl groups and phenolic hydroxy groups. In addition, the functional group for film curing undergoes crosslinking reaction with component (C) through an isocyanate group resulting from the blocked moiety of component (C) at a more elevated temperature in the heat crosslinked products between component (A) and component (B) (in exposed part, in de-crosslinked product from which the heat crosslinked products are further dissociated), and a group that can make film cure. The representative group thereof is at least one selected from the group consisting of hydroxy groups other than phenolic hydroxy groups, and amino groups having an active hydrogen. The amino groups having an active hydrogen mean primary or secondary amino groups that can release hydrogen by reaction. Therefore, as amide groups have no active hydrogen, they do not fall under the amino groups having an active hydrogen.

The resins of component (A) may be any alkali-soluble resins having the above-mentioned structure, and are not specifically limited on the kind of main chain and side chain constituting the resins.

However, the resins of component (A) have a number average molecular weight ranging from 2,000 to 30,000. When the resin is a large one having a number average molecular weight more than 30,000, it is liable to occur developing residues and is largely lowered in sensitivity. On the other hand, when the resin is a small one having a number average molecular weight less than 2,000, it occur a large amount of film reduction of unexposed part on development, and thus it often leads to insufficient cure.

The alkali-soluble resins of component (A) include for example acrylic resins, polyhydroxystyrene resins and the like. Particularly, acrylic resins are more preferable due to high transparency.

In the present invention, an alkali-soluble resin composed of a copolymer obtained by polymerizing plural monomers (hereinafter, referred to as specific copolymer) can be used as component (A). In such a case, the alkali-soluble resin of component (A) may be a blend of plural specific copolymers.

That is, the above-mentioned specific copolymer is a copolymer formed by using as essential structural units at least one monomer suitably selected from the group consisting of monomers having either or both of a carboxyl group and a phenolic hydroxy group, and at least one monomer suitably selected from the group of monomers having either or both of a hydroxy group other than phenolic hydroxy groups, and an amino group having an active hydrogen, and the copolymer has a number average molecular weight ranging from 2,000 to 30,000.

The above-mentioned "monomers having either or both of a carboxyl group and a phenolic hydroxy group" include a monomer having a carboxyl group, a monomer having a phenolic hydroxy group, and a monomer having both a carboxyl group and a phenolic hydroxy group. These monomers include not only a monomer having one carboxyl group or phenolic hydroxy group but also a monomer having plural carboxyl groups or phenolic hydroxy groups.

In addition, the above-mentioned "monomers having either or both of a hydroxy group other than phenolic hydroxy groups, and an amino group having an active hydrogen" include a monomer having a hydroxy group other than phenolic hydroxy groups, a monomer having an amino group having an active hydrogen, and a monomer having both a hydroxy group other than phenolic hydroxy groups and an amino group having an active hydrogen. These monomers include not only a monomer having one hydroxy group other than phenolic hydroxy groups or one amino group having an active hydrogen but also a monomer having plural hydroxy groups other than phenolic hydroxy groups or amino groups having an active hydrogen.

Hereinafter, concrete examples of the above-mentioned monomers are mentioned, but the present invention is limited thereto.

The monomer having a carboxyl group includes for example acrylic acid, methacrylic acid, crotonic acid, mono-(2-(acryloyloxy)ethyl)phthalate, mono-(2-(methacryloyloxy)ethyl)phthalate, N-(carboxyphenyl)maleimide, N-(carboxyphenyl)methacrylamide, N-(carboxyphenyl)acrylamide, and the like.

The monomer having a phenolic hydroxy group includes for example hydroxystyrene, N-(hydroxyphenyl)acrylamide, N-(hydroxyphenyl)methacrylamide, N-(hydroxyphenyl)maleimide, and the like.

The monomer having a hydroxy group other than phenolic hydroxy groups includes for example 2-hydroxyethyl acrylate, 2-hydroxypropyl acrylate, 5-acryloyloxy-6-hydroxynorbornene-2-carboxylic-6-lactone, 2-hydroxyethyl methacrylate, 2-hydroxypropyl methacrylate, 5-methacryloyloxy-6-hydroxynorbornene-2-carboxylic-6-lactone, and the like.

The monomer having an amino group having an active hydrogen includes for example 2-aminoethyl acrylate, 2-aminomethyl methacrylate, and the like.

In addition, the specific copolymer may be a copolymer formed by using as a structural unit also a monomer (hereinafter, referred to as other monomer) other than the monomer having the functional group for heat crdsslinking reaction and the monomer having the functional group for film curing.

Other monomer may be a monomer that can be copolymerized with a monomer having either or both of a carboxyl group and a phenolic hydroxy group, and a monomer having either or both of a hydroxy group other than phenolic hydroxy groups, and an amino group having an active hydrogen, and is not specifically limited so long as it does not deteriorate the characteristics of component (A).

Concrete examples of other monomer include acrylic acid ester compounds, methacrylic acid ester compounds, maleimide compounds, acrylonitrile, maleic anhydride, styrene compounds and vinyl compounds, etc.

The acrylic acid ester compounds include for example methyl acrylate, ethyl acrylate, isopropyl acrylate, benzyl acrylate, naphthyl acrylate, anthryl acrylate, anthrylmethyl acrylate, phenyl acrylate, 2,2,2-trifluoroethyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-propyl-2-adamantyl acrylate, 8-methyl-8-tricyclodecyl acrylate, and 8-ethyl-8-tricyclodecyl acrylate, etc.

The methacrylic acid ester compounds include for example methyl methacrylate, ethyl methacrylate, isopropyl methacrylate, benzyl methacrylate, naphthyl methacrylate, anthryl methacrylate, anthrylmethyl methacrylate, phenyl methacrylate, 2,2,2-trifluoroethyl methacrylate, tert-butyl methacrylate, cyclohexyl methacrylate, isobornyl methacrylate, 2-methoxyethyl methacrylate, methoxytriethylene glycol methacrylate, 2-ethoxyethyl methacrylate, tetrahydrofurfuryl methacrylate, 3-methoxybutyl methacrylate, 2-methyl-2-adamantyl methacrylate, 2-propyl-2-adamantyl methacrylate, 8-methyl-8-tricyclodecyl methacrylate, and 8-ethyl-8-tricyclodecyl methacrylate, etc.

The vinyl compounds include for example methyl vinyl ether, benzyl vinyl ether, 2-hydroxyethyl vinyl ether, phenyl vinyl ether, and propyl vinyl ether, etc.

The styrene compounds include for example styrene, methylstyrene, chlorostyrene, bromostyrene, etc.

The maleimide compounds include for example maleimide, N-methyl maleimide, N-phenyl maleimide, and N-cyclohexyl maleimide, etc.

The method for obtaining the specific copolymer used in the present invention is not specifically limited, and the copolymer is obtained for example by subjecting at least one monomer suitably selected from the group consisting of monomers having either or both of a carboxyl group and a phenolic hydroxy group, and at least one monomer suitably selected from the group of monomers having either or both of a hydroxy group other than phenolic hydroxy groups, and an amino group having an active hydrogen, and optionally a monomer other than the above-mentioned monomers, and optionally a polymerization initiator, and the like in a solvent to polymerization reaction at a temperature of 50 to 110° C. The solvent used in the reaction is not specifically limited so long as it dissolves the monomers constituting the specific copolymer and the specific copolymer. The concrete examples include the solvents mentioned below for component (E) (solvent).

The specific copolymer obtained as mentioned above generally is in a state of solution in which the specific copolymer is dissolved in the solvent.

In addition, powder of the specific copolymer can be obtained by placing the solution of specific copolymer obtained as mentioned above in diethyl ether or water with stirring to be re-precipitated, and filtrating and washing the resulting precipitate, and then drying at normal temperature or with heating under normal pressure or reduced pressure. The above-mentioned procedures makes possible to remove polymerization initiator and unreacted monomers that are present together with the specific copolymer. As a result of it, powder of purified specific copolymer is obtained. If it cannot be fully purified, after dissolving the resulting powder in a solvent again, the above-mentioned procedures may be repeated.

In the present invention, the powder of the specific copolymer may be used as such, or as a state of solution obtained by dissolving the powder in a solvent such as component (E) as mentioned below again.

<Component (B)>

Component (B) is a compound having two or more vinyl ether groups per molecule. The kind and structure thereof are not specifically limited so long as it is a compound having two or more vinyl ether groups per molecule so as to heat crosslink with an alkali-soluble resin of component (A) at a conventional pre-baking temperature.

The compound of component (B) is separated (de-crosslinked) from the alkali-soluble resin of component (A) with an acid produced by exposure to light in the presence of a photoacid generator after heat crosslinking with the alkali-soluble resin of component (A), and thereafter removed together with the alkali-soluble resin of component (A) by development with an alkaline developer. Therefore, as this sort of compounds, vinyl ether compounds used for a component of vinyl ether chemically-amplified type resists, and the like can be applied. When such compounds are used, there is an advantage that the form to be formed can be regulated by controlling heat crosslink density by altering the added amount of the compound.

As the compound of component (B), the above-mentioned vinyl ether compounds, particularly the compounds of formulae (1) and (2) are preferable from the viewpoint that exposed parts are developed without residual film or residue.

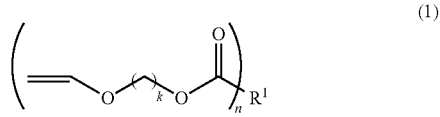

(1)

wherein n is a number of 2 to 10, k is a number of 1 to 10 and $R^1$ is an organic group of n-valence.

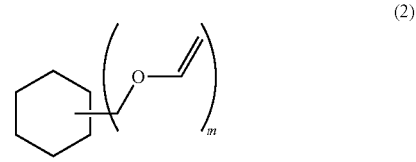

(2)

wherein m is a number of 2 to 10.

In formula (1), n is the number of vinyl ether groups in one molecule, and it is preferable that n is an integer of 2 to 4. In addition, m in formula (2) is the number of vinyl ether groups in one molecule, and it is preferable that m is an integer of 2 to 4.

Concrete examples of the compounds of formulae (1) and (2) include bis(4-(vinyloxymethyl)cyclohexylmethyl) glutarate, tri(ethyleneglycol)divinylether, divinyl adipate, diethylene glycol divinylether, tris(4-vinyloxy)butyltrimellitate, bis(4-(vinyloxy)butyl) terephthalate, bis(4-(vinyloxy)butyl-isophthalate, and cyclohexane dimethanol divinylether, and the like.

In addition, the compound of component (B) is used in an amount of 1 to 80 mass parts, preferably 5 to 40 mass parts based on 100 mass parts of the alkali-soluble resin of component (A). If the used amount of the compound of component (B) is less than the lower limit, film reduction of unexposed parts becomes remarkable, and pattern-like relief shape becomes bad. On the other hand, if the used amount of the compound of component (B) is more than the upper limit, sensitivity of film is remarkably lowered, and residues between patterns occur after development.

<Component (C)>

Component (C) is a compound having two or more blocked isocyanate groups per molecule. The kind and structure thereof are not specifically limited so long as it is a compound having two or more blocked isocyanate groups per molecule so as to undergo thermoset reaction for a film composed of an alkali-soluble resin of component (A) heat crosslinked with the compound of component (B) or de-crosslinked therewith at a conventional pre-baking temperature.

The compound of component (C) is a compound having per molecule, two or more blocked isocyanate groups that isocyanate groups (—NCO) are blocked with suitable protective group. When the compound is exposed to an elevated temperature on thermoset reaction, the protective groups (blocked parts) are removed by heat dissociation, and crosslinking reaction through the resulting isocyanate group with the functional groups of the alkali-soluble resin of component (A) (for example hydroxy groups other than phenolic hydroxy groups and amino groups having active hydrogen) progresses. The compound includes for example the compound having two or more groups (these groups may be identical with or different from each other) of formula (3)

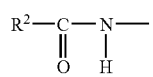

(3)

wherein $R^2$ is an organic group of blocked moiety.

The compound of component (C) having two or more blocked isocyanate groups per molecule can be obtained for example by reacting a suitable blocking agent with compound having two or more isocyanate groups per molecule.

The compound having two or more isocyanate groups per molecule includes for example isophorone diisocyanate, 1,6-hexamethylene diisocyanate, methylene bis(4-cyclohexyl isocyanate), trimethylhexamethylene diisocyanate, or the like, or dimers or trimers thereof, or products obtained by reaction of them with diols, triols, diamines or triamines.

The blocking agent includes for example alcohols such as methanol, ethanol, isopropanol, n-butanol, 2-ethoxyhexanol, 2-N,N-dimethylaminoethanol, 2-ethoxyethanol, cyclohexanol, etc., phenols such as phenol, o-nitrophenol, p-chlorophenol, o-, m- or p-cresol, etc., lactams such as ε-caprolactam, etc., oximes such as acetone oxime, methyl ethyl ketone oxime, methyl isobutyl ketone oxime, cyclohexanone oxime, acetophenone oxime, benzophenone, etc., pyrazoles such as pyrazole, 3,5-dimethylpyrazole, 3-methylpyrazole, etc., thiols such as dodecane thiol, benzene thiol, etc.

Although the compounds of component (C) are compounds that undergo crosslinking reaction through isocyanate groups resulting from heat dissociation of the blocked moieties at an elevated temperature such as a post baking temperature, compounds having a heat dissociation temperature (for example, 120 to 230° C.) of blocked moiety that is considerably higher than pre-baking temperature are particularly preferable as the compound of component (C) so that crosslink does not progress at a lower temperature such as pre-baking temperature.

As such compounds of component (C), for example the following concrete examples can be mentioned.

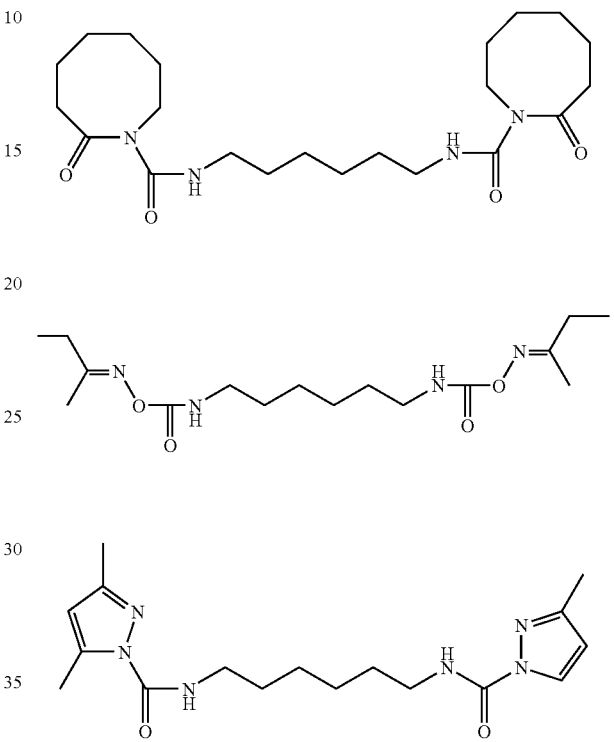

The compounds of component (C) in which isocyanate compounds are derived from isophorone diisocyanate are more preferable from the viewpoint of heat resistance or film properties, and such compounds include the followings. In the meantime, in the following formulae, R is an organic group.

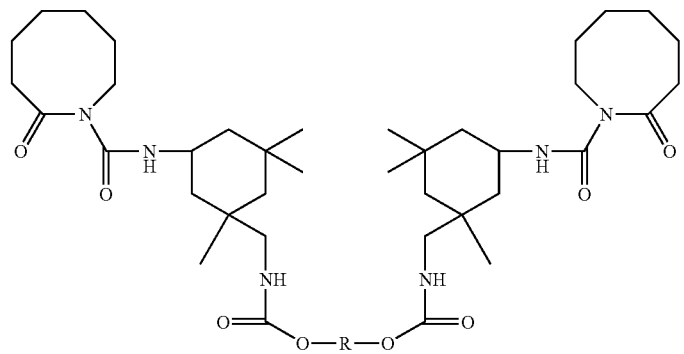

-continued
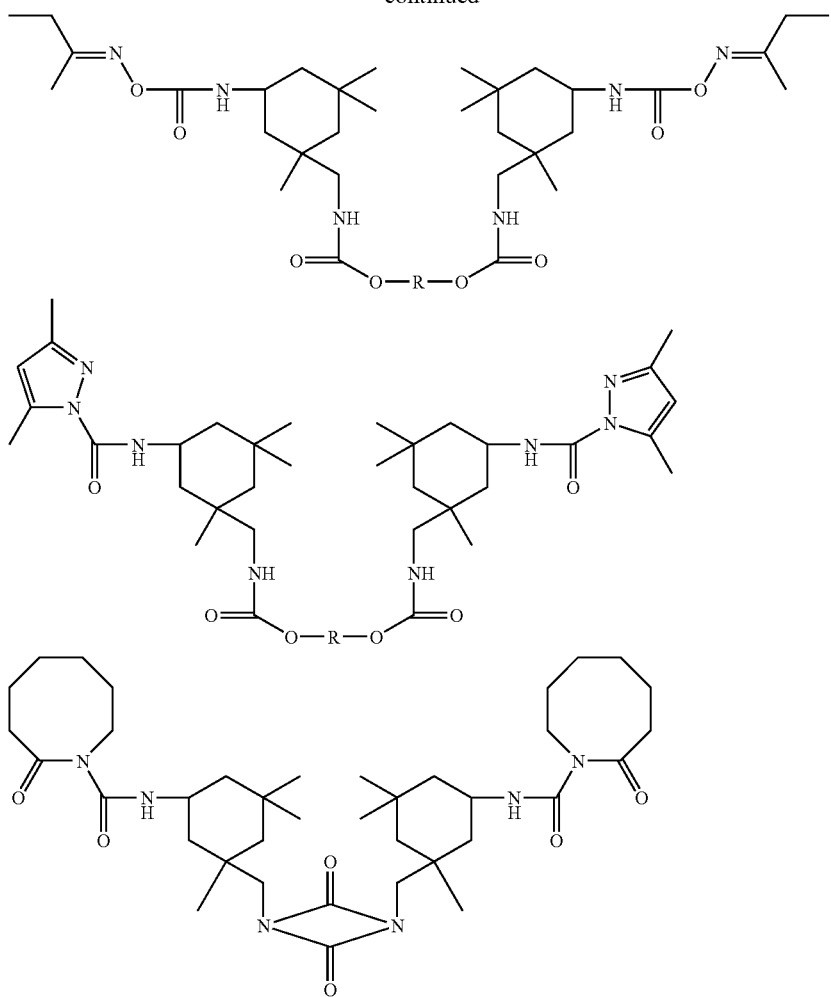
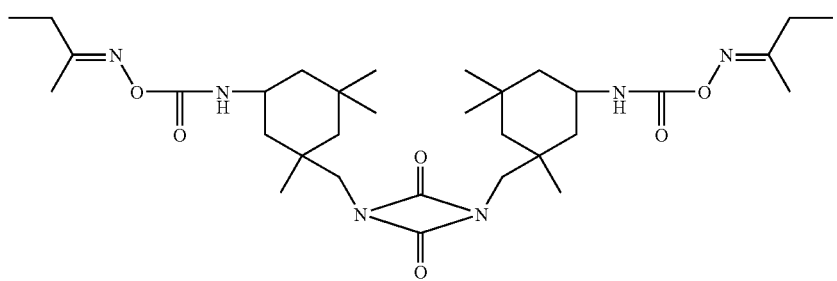
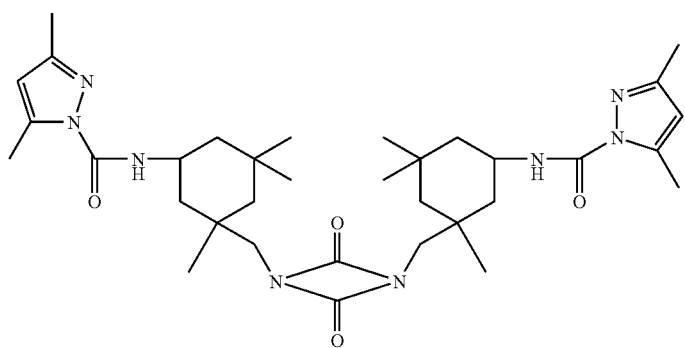

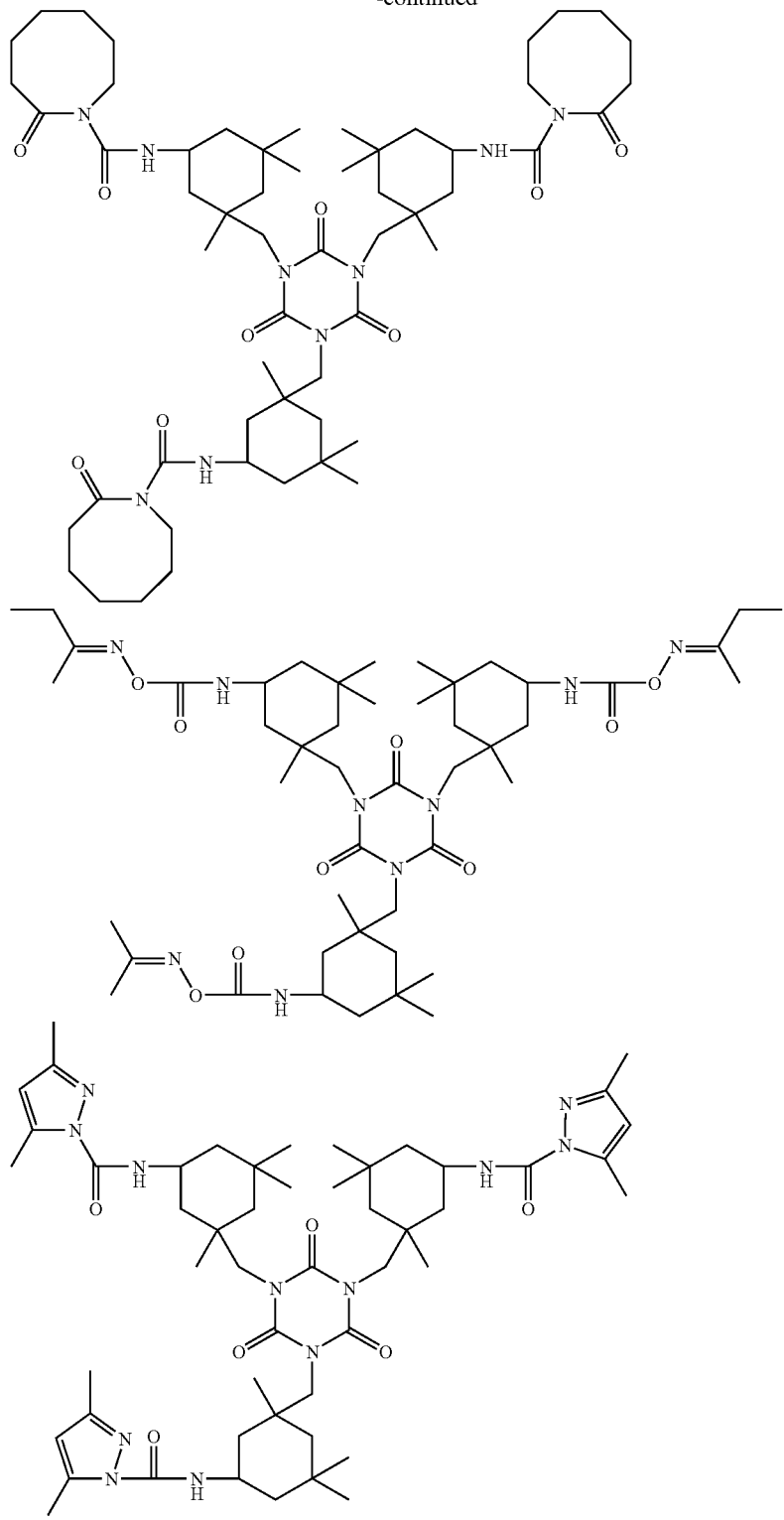

In the present invention, the compound of component (C) may be used alone or in a combination of two or more.

In addition, the compound of component (C) is used in an amount of 1 to 80 mass parts, preferably 5 to 40 mass parts based on 100 mass parts of the alkali-soluble resin of component (A). If the used amount of the compound of component (C) is less than the lower limit, thermoset reaction becomes insufficient, and sufficient cured film cannot be obtained. On the other hand, if the used amount of the compound of component (C) is more than the upper limit, development becomes insufficient, and residue after development occurs.

<Component (D)>

Component (D) is a photoacid generator (PAG). This is a substance that generates an acid (sulfonic acids, carboxylic acids, or the like) directly or indirectly by irradiation of a light used for exposure (UV light such as g-, h-, i-line, etc., ArF, KrF or $F_2$ laser light, or electron beam, or the like). The kind and structure thereof are not specifically limited so long as it has the above-mentioned property.

The photoacid generators of component (D) include for example diazomethane compounds, onium salt compounds, sulfonimide compounds, disulfone compounds, sulfonic acid derivative compounds, nitrobenzyl compounds, benzoin tosylate compounds. iron arene complex, halogen-containing triazine compounds, acetophenone derivative compounds, and cyano-containing oxim sulfonate compounds, and the like. The photoacid generators that are conventionally known or have been conventionally used can be applied without limitation. In the meantime, the photoacid generators of component (D) may be used alone or in a combination of two or more.

The concrete examples of the photoacid generators include the followings. Needless to say, the compounds mentioned below are merely examples among a greatly large number of photoacid generators that can be applied, and naturally the present invention is not limited thereto.

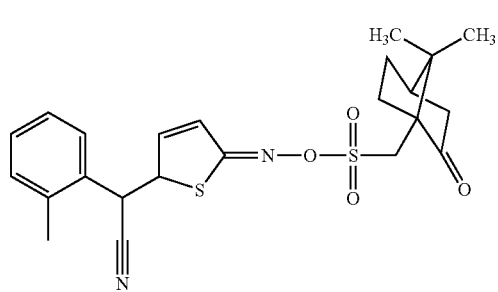
(4)

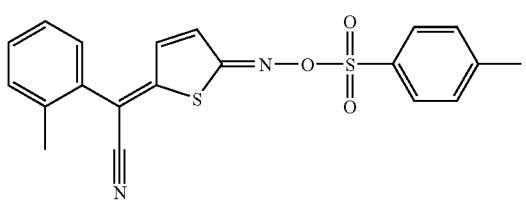
(5)

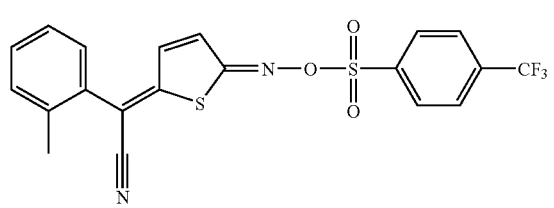
(6)

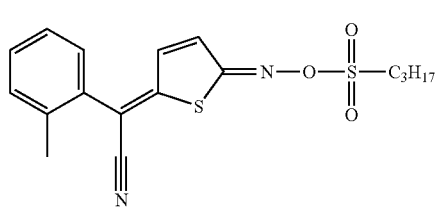
(7)

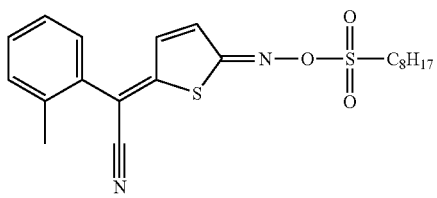
(8)

diphenyliodonium chloride, diphenyliodonium trifluoromethane sulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl) iodonium hexafluorophosphate, bis(p-tert-butylphenyl) iodonium mesylate, bis(p-tert-butylphenyl) iodonium tosylate, bis(p-tert-butylphenyl) iodonium trifluoromethane sulfonate, bis(p-tert-butylphenyl) iodonium tetrafluoroborate, bis(p-tert-butylphenyl) iodonium chloride, bis(p-chlorophenyl) iodonium chloride, bis(p-chlorophenyl) iodonium tetrafluoroborate, triphenylsulfonium chloride, triphenylsulfonium bromide, triphenylsulfonium trifluoromethane sulfonate, tri(p-methoxyphenyl) sulfonium tetrafluoroborate, tri(p-methoxyphenyl) sulfonium hexafluorophosphonate, tri(p-ethoxyphenyl) sulfonium tetrafluoroborate, triphenylphosphonium chloride, triphenylphosphonium bromide, tri(p-methoxyphenyl)phosphonium tetrafluoroborate, tri(p-methoxyphenyl)phosphonium hexafluoro phosphonate, tri(p-ethoxyphenyl)phosphonium tetrafluoroborate,

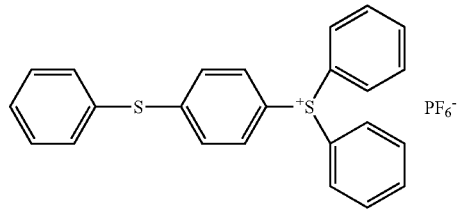
(9)

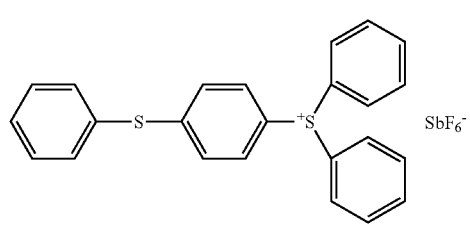
(10)

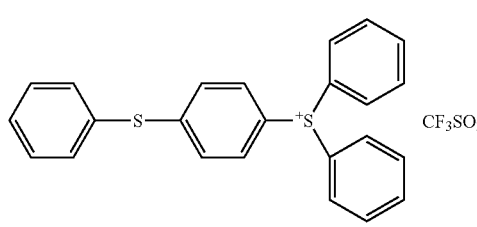
(11)

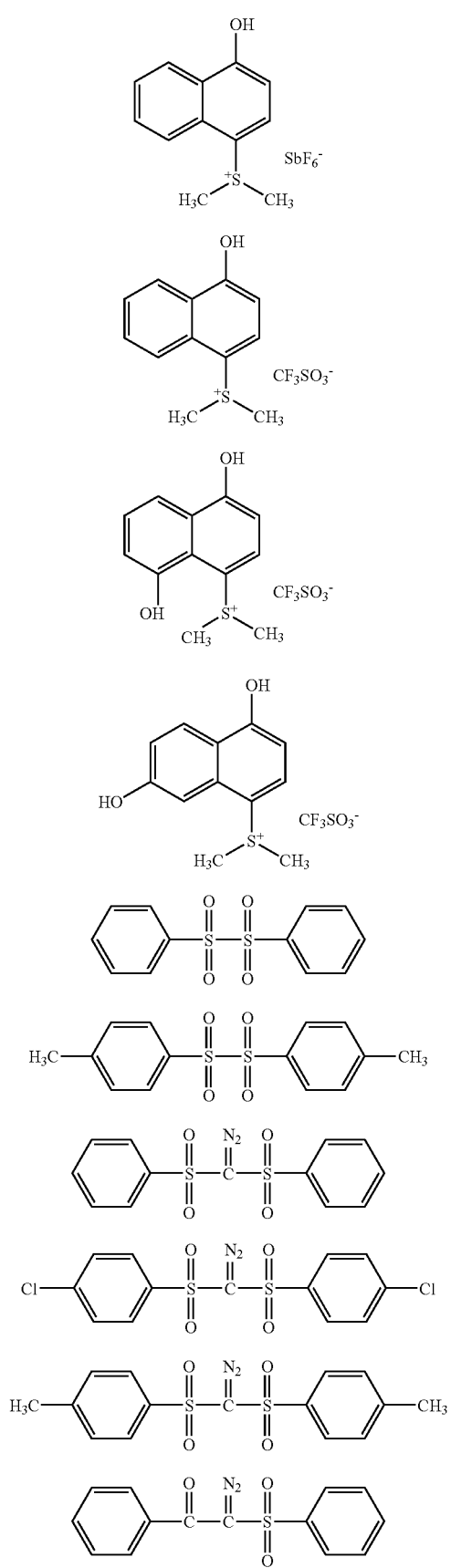
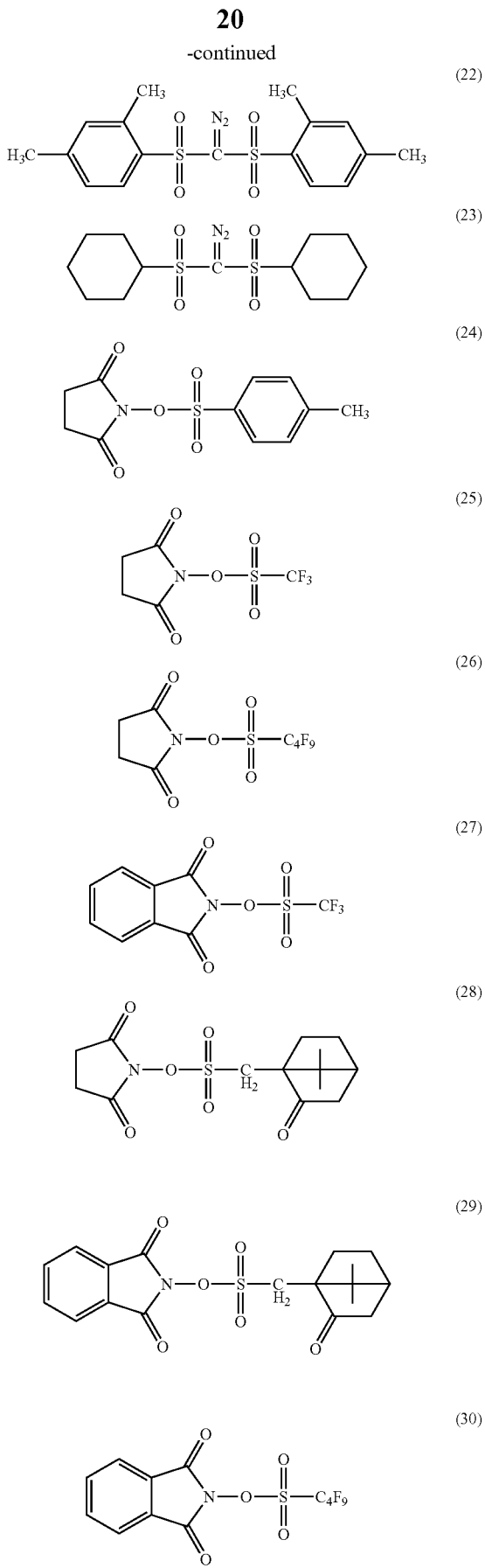

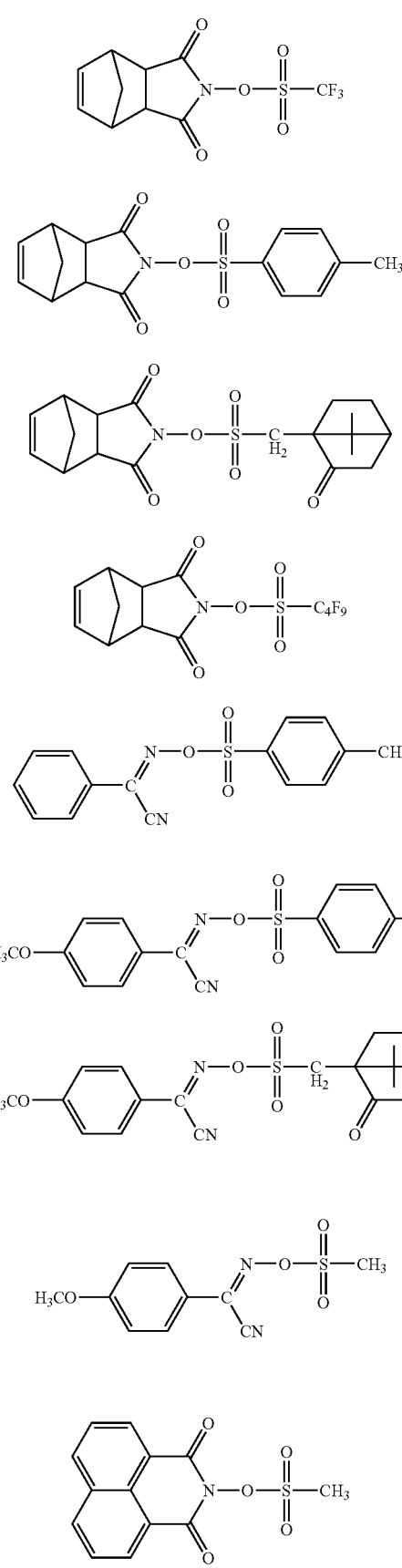
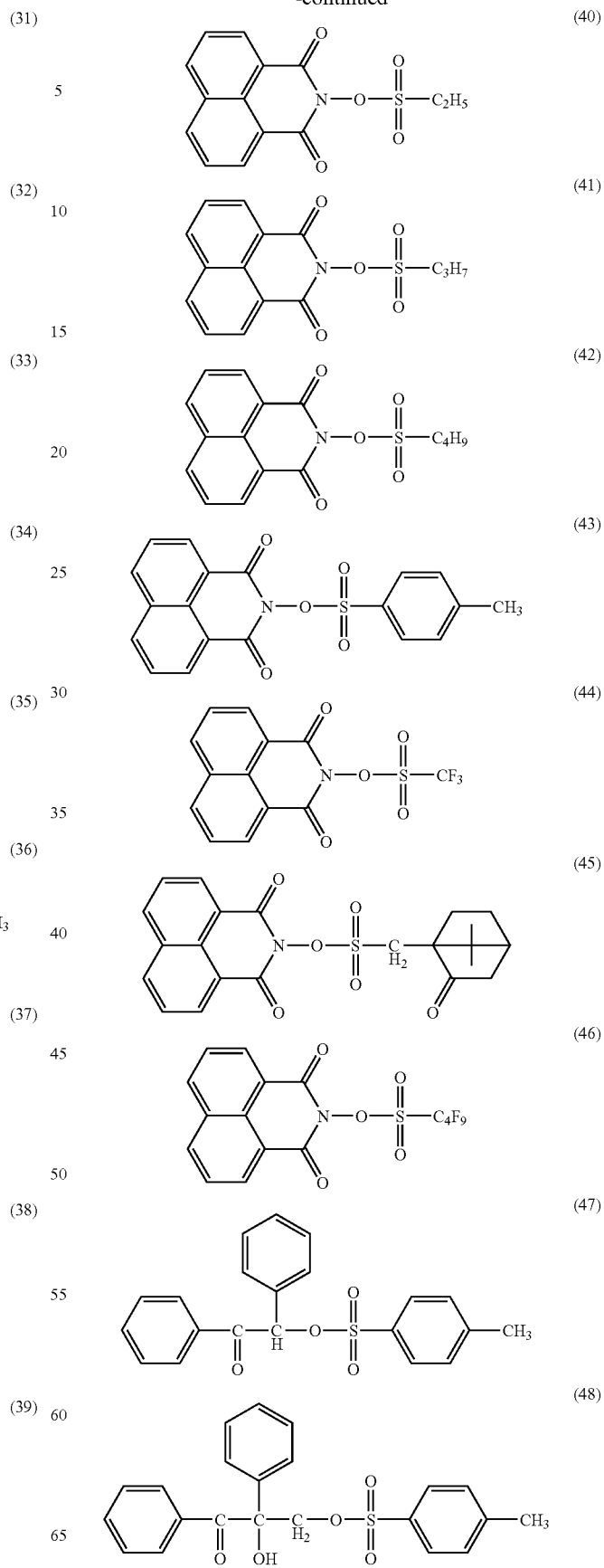

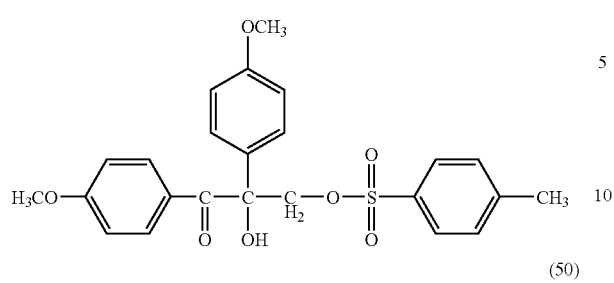
(49)
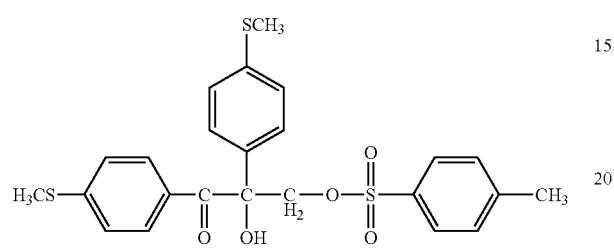
(50)
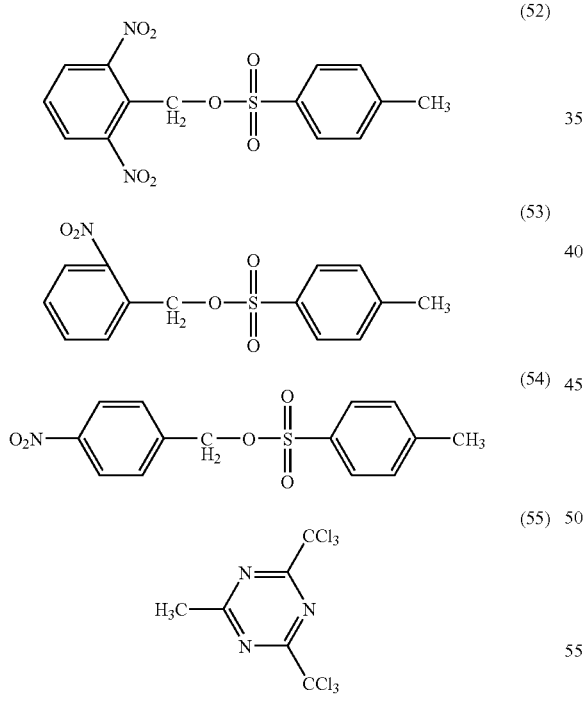
(51)
(52)
(53)
(54)
(55)
(56)
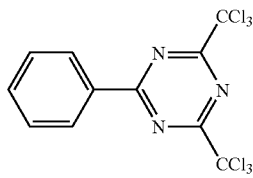
(57)
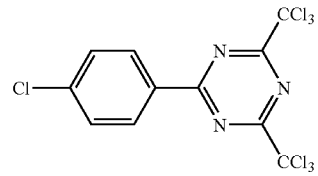
(58)
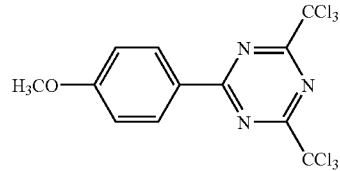
(59)
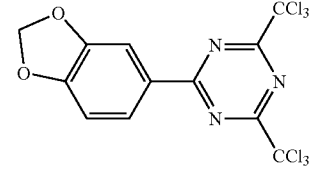
(60)
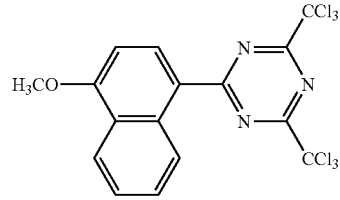
(61)
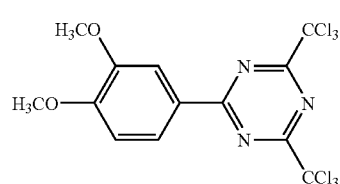
(62)
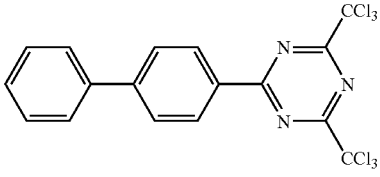
(63)
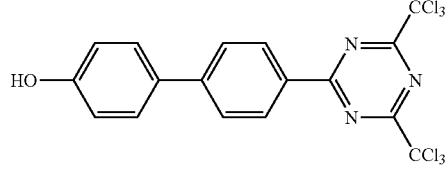
(64)

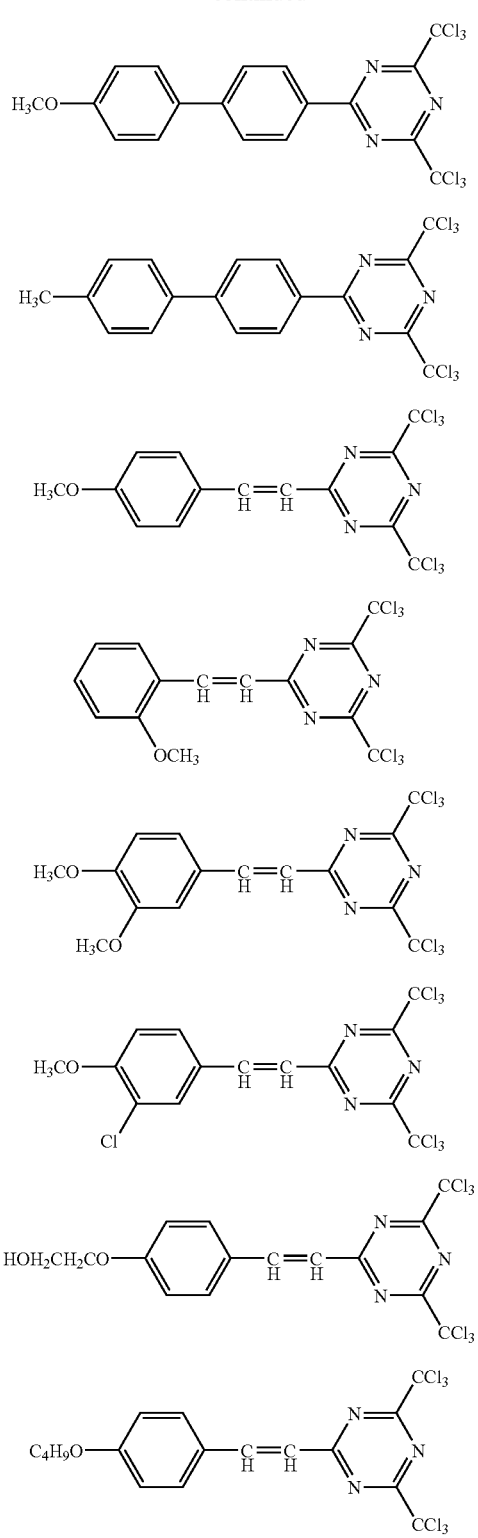

In the present invention, one kind of the photoacid generator selected from the group of the above-mentioned compounds can be used alone, or two or more kinds of the photoacid generators selected from the group of the above-mentioned compounds may be used in a combination.

In addition, the photoacid generator of component (D) is used in an amount of 0.5 to 80 mass parts, preferably 1 to 30 mass parts based on 100 mass parts of the alkali-soluble resin of component (A). If the used amount of the photoacid generator of component (D) is less than the lower limit, on exposure to light, the compound of component (B) is not fully dissociated from the alkali-soluble resin of component (A), and pattern-like relief shape becomes bad. On the other hand, if the used amount of the photoacid generator of component (D) is more than the upper limit, the shelf stability of the positive-type photosensitive resin composition is deteriorated.

<Component (E)>

Component (E) used in the present invention is a solvent that dissolves components (A) to (D), and also dissolves components (F) to (H) optionally added and mentioned below. The kind and structure thereof are not specifically limited so long as the solvent has the above-mentioned dissolving ability.

Such component (E) includes for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone, etc. These solvents may be used singly or in combination of two or more of them.

Among these components (E), propylene glycol monomethyl ether, propylene glycol monomethyl ether acetate, 2-heptanone, propylene glycol propyl ether, propylene glycol propyl ether acetate, ethyl lactate, butyl lactate, and the like are preferable from the viewpoint that they have good film properties and a high safety. These solvents are generally used as solvents for photoresist material.

<Component (F)>

Component (F) is other alkali-soluble resin other than component (A). The positive-type photosensitive resin composition of the present invention can contain further other alkali-soluble resin other than component (A) so long as it would not vitiate the effects of the present invention. It is preferably desirable to add component (F) in an amount of 1 to 90 mass parts based on 100 mass parts of component (A).

Such a component (F) includes for example acrylic resins and hydroxystyrene reins, phenol novolak resins, polyamide resins, polyimide precursors, polyimide resins, and the like, other than component (A).

<Component (G)>

Component (G) is an amine compound. The positive-type photosensitive resin composition of the present invention can contain further amine compound for the purpose of an improvement of shelf stability so long as it would not vitiate the effects of the present invention.

The amine compound of component (G) includes for example tertiary amines such as triethanol amine, tributanol amine, trimethyl amine, triethyl amine, tri-n-propyl amine, tri-isopropyl amine, tri-n-butyl amine, tri-tert-butyl amine and diazabicyclooctane, etc., aromatic amines such as pyridine and 4-dimethylamino pyridine, etc., primary amines such as benzyl amine and n-butyl amine, etc., and also secondary amines such as diethyl amine and di-n-butyl amine, etc., which are not limited thereto. The amine compound of component (G) can be used alone or in a combination of two or more.

If the amine compound is used, the added amount thereof is for example 0.001 to 5 mass parts, or in some cases 0.005 to 1 mass part, or preferably 0.01 to 0.5 mass part, based on 100 mass parts of the alkali-soluble resin of component (A). If the used amount of the amine compound of component (G) is less than the lower limit, the shelf stability of the positive-type photosensitive resin composition is not occasionally improved to a sufficient level. On the other hand, if the used amount of the amine compound of component (G) is more than the upper limit, the sensitivity of the positive-type photosensitive resin composition is occasionally deteriorated.

<Component (H)>

Component (H) is a surfactant. The positive-type photosensitive resin composition of the present invention can contain further surfactant for the purpose of an improvement of coatability so long as it would not vitiate the effects of the present invention.

The surfactant of component (H) includes for example fluorine based surfactants, silicone based surfactants, non-ionic surfactants, and the like which are not limited thereto. As this sort of surfactants, for example commercially available products manufactured by Sumitomo 3M Limited, Dainippon Ink and Chemicals, Inc. or Asahi Glass Co., Ltd., and the like can be used. These commercially products are advantageous as they can be easily obtained. The concrete examples include fluorine based surfactants such as EFTOP EF301, EF303, EF352 (manufactured by Jemco Inc.), MEGAFAC F171, F173 (manufactured by Dainippon Ink and Chemicals, Inc.), FLUORAD FC430, FC431 (manufactured by Sumitomo 3M Limited), ASAHI GUARD AG710, SURFLON S-382, SC101, SC102, SC103, SC104, SC105, SC106 (manufactured by Asahi Glass Co., Ltd.). The surfactant of component (H) can be used singly or in combination of two or more.

If the surfactant is used, the added amount thereof is generally 0.2 mass % or less, preferably 0.1 mass % or less, in 100 mass % of the positive-type photosensitive resin composition. Even when the used amount of the surfactant of component (H) set to an amount over 0.2 mass %, coatability is not improved so much, and thus it is not economical.

<Other Additives>

Further, the positive-type photosensitive resin composition of the present invention can contain rheology controlling agents, adhesion auxiliaries such as silane coupling agents or the like, pigments, dyes, shelf stabilizing agents, anti-foaming agents, or dissolution accelerators such as polyhydric phenols, polyhydric carboxylic acids according to need so long as it would not vitiate the effects of the present invention.

<Positive-Type Photosensitive Resin Composition>

The positive-type photosensitive resin composition of the present invention is a composition that contains an alkali-soluble resin of component (A), a compound having vinyl ether groups of component (B), a compound having blocked isocyanate groups of component (C), a photoacid generator of component (D) and component (E), and that optionally contains at least one of other alkali-soluble resin of component (F), an amine compound of component (G), a surfactant of component (H) and other additives.

Among them, preferable examples of the positive-type photosensitive resin composition according to the present invention are as follows:

[1]: The positive-type photosensitive resin composition containing 1 to 80 mass parts of component (B), 1 to 80 mass parts of component (C), and 0.5 to 80 mass parts of component (D), based on 100 mass parts of component (A), and in which these components are dissolved in component (E);

[2]: The positive-type photosensitive resin composition set forth in [1], further comprising component (F) in an amount of 1 to 90 mass parts based on 100 mass parts of component (A);

[3]: The positive-type photosensitive resin composition set forth in [1] or [2], further comprising component (G) in an amount of 0.001 to 5 mass parts based on 100 mass parts of component (A); and

[4]: The positive-type photosensitive resin composition set forth in [1], [2] or [3], further comprising component (H) in an amount of 0.2 mass % or less.

The proportion of the solid content in the positive-type photosensitive resin composition of the present invention is not specifically limited so long as each component is dissolved homogeneously in the solvent, and it is for example 1 to 80 mass %, or for example 5 to 60 mass %, or 10 to 50 mass %. In this specification, the solid content means all components in the positive-type photosensitive resin composition from which the component (E) is excluded.

[Production Process of Positive-Type Photosensitive Resin Composition]

The production process of the positive-type photosensitive resin composition according to the present invention is not specifically limited, and for example comprises dissolving component (A) (an alkali-soluble resin) in component (E), and mixing in the resulting solution component (B) (a compound having two or more vinyl ether groups per molecule), component (C) (a compound having two or more blocked isocyanate groups per molecule), component (D) (a photoacid generator) and component (H) (a surfactant) in a predetermined ratio to obtain a homogeneous solution, or in a suitable step of the production process, further mixing component (G) (an amine compound), component (F) (other alkali-soluble resin) and/or other additives according to need.

In the production of the positive-type photosensitive resin composition according to the present invention, the solution of the specific copolymer obtained by the polymerization in component (E) can be used as such. In this case, when the homogeneous solution is prepared by adding component (B), component (C) and the like similarly to the above in the solution of component (A), component (E) may be further added in order to adjust the concentration. In this procedure, component (E) used in the forming process of the specific copolymer may be identical with or different from component (E) used for the concentration adjustment in the preparation of the positive-type photosensitive resin composition.

It is preferable to use after filtering the solution of the positive-type photosensitive resin composition produced as mentioned above through a filter having a pore diameter of about 0.2 μm or the like.

Preferably in the above-mentioned production process, it is desirable to obtain a positive-type photosensitive resin composition containing a crosslinked product of component (A) with component (B) in addition to components (A) to (E) and optionally components (F) to (H), by proceeding with heat crosslinking reaction mentioned below to some extent by maintaining a mixed solution containing components (A) to (E) and optionally components (F) to (H) at an elevated temperature compared with room temperature for a predetermined time.

Further preferably, the positive-type photosensitive resin composition containing a crosslinked product of component (A) with component (B) in addition to components (A) to (E)

and optionally components (F) to (H) is produced by maintaining the mixed solution at a temperature of 30 to 70° C. for 2 hours to 5 days.

The production under the above-mentioned condition of temperature and time improves homogeneity of the resulting resin composition, and thus in case where a film is produced from the composition, photoacid generators are efficiently dispersed in the film, consequently the sensitivity of the film is remarkably increased.

If the stirring temperature is set to a temperature more than 70° C., crosslinking reaction or curing reaction progresses and thus the composition becomes heterogeneous and the sensitivity of the resulting film is largely lowered. On the other hand, if the temperature is less than 30° C., no homogeneous composition is obtained and it does not lead to the improvement of sensitivity.

[Process for Forming Coating Film, Pattern and Cured Film]

The positive-type photosensitive resin composition of the present invention is coated on a substrate used for semiconductor (for example, silicon/silicon dioxide coat substrate, silicon nitride substrate, substrate coated with metal such as aluminum, molybdenum, chromium, or the like, glass substrate, quartz substrate, ITO substrate or the like) by spin-coating, flow-coating, roll-coating, slit-coating, slit-coating followed by spin-coating, inkjet-coating or the like, and then pre-dried in a hot plate or an oven, etc. to form a coating film. Thereafter, the coating film is subjected to heating treatment to form a positive-type photosensitive resin film.

As the condition for the heating treatment, for example temperature and time of heating suitably selected from temperature range of 70 to 160° C. and time range of 0.3 to 60 minutes are applied. The temperature and time of heating are preferably 80 to 140° C. and 0.5 to 10 minutes, respectively. The film thickness of the positive-type photosensitive resin film formed from the positive-type photosensitive resin composition is for example 0.1 to 50 μm, or for example 0.3 to 30 μm, or further for example 0.5 to 10 μm.

In addition, the formed positive-type photosensitive resin film becomes a film that is slightly soluble in an alkaline developer by crosslink formation of a compound having vinyl ether groups of component (B) with a resin of component (A) with heating treatment during the formation. In this case, if the temperature of heating treatment is less than the lower limit, heat crosslink becomes insufficient, and thus film reduction of unexposed part often occurs. On the other hand, if the temperature of heating treatment is more than the upper limit, heat crosslinked parts once formed are cut again, and thus film reduction of unexposed part often occurs.

When the positive-type photosensitive resin film formed from the positive-type photosensitive resin composition according to the present invention is exposed to light by irradiation of UV light, ArF, KrF or $F_2$ laser light, or the like, the exposed part in the film becomes soluble in an alkaline developer by the action of acid generated from a photoacid generator (PAG) of component (D) contained in the positive-type photosensitive resin film. The above-mentioned exposure is preferably carried out by using light having at least one wavelength of i-line, g-line and h-line, or ArF, KrF or $F_2$ laser light.

Then, the positive-type photosensitive resin film is subjected to post exposure bake (PEB). As condition of heating in this case, a heating temperature and a heating time are suitably selected from the range of 80 to 150° C. and 0.3 to 60 minutes, respectively, and applied.

After that, development is conducted by use of an alkaline developer. The development removes exposed part in the positive-type photosensitive resin film, and thus leads to the formation of pattern-like relief.

The alkaline developer that can be used includes for example alkaline aqueous solutions for example an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. Further, surfactants or the like can be added in these developers.

Among the above-mentioned developers, 0.1 to 2.38 mass % aqueous solutions of tetramethylammonium hydroxide that are universally utilized as developers for photoresists can be used also for development in the positive-type photosensitive resin composition according to the present invention without any problems such as swelling.

In addition, the methods for development may be liquid-filling method, dipping method, shake-dipping method or the like. The time of development is generally 15 to 180 seconds.

After development, the positive-type photosensitive resin film is washed with running water for 20 to 90 seconds, then air-dried by use of compressed air or compressed nitrogen or with spinning and thus water content on the substrate is removed and a patterned film is obtained.

Subsequently, the patterned film is subjected to post-baking for thermosetting, concretely heating by use of hot plate, oven or the like, and thereby films excellent in heat resistance, transparency, flattening property, low water-absorbing property, chemical resistance and the like, and having a good relief pattern are produced.

The post-baking is carried out at a heating temperature selected from the range of 140 to 250° C. In case where a hot plate is used, the post-baking is carried out for 5 to 30 minutes. In case where an oven is used, the post-baking is carried out for 30 to 90 minutes. The post-baking can provide a cured film having a good pattern form that is aimed.

As mentioned above, the positive-type photosensitive resin composition of the present invention can form a coated film that has a fully high sensitivity and little film reduction of unexposed part on development, and a fine pattern. In addition, a cured film obtained from the coated film is excellent in heat resistance, solvent resistance and transparency.

Further, in case where this sort of cured film is used as an array flattening film for liquid crystal display, it is subjected to heating at a higher temperature (for example 250° C.) on metal vapor deposition, or a long-term baking at a higher temperature (for example 230° C.) in some cases, or is placed under contact with a resist stripping liquid being amine solution such as monoethanol amine (MEA) or the like on resist stripping after etching. Therefore, the cured film is required to have a high resistance for baking at a high temperature (or a long-term baking) or for a treatment with resist stripping liquid (amine solution).

The cured film manufactured according to the present invention shows little lowering in transmittance, maintains a high transparency, shows little decrease in film thickness, and becomes cured film excellent in heat resistance and chemical resistance, even after baking at a high temperature (or a long-term baking) or a treatment with resist stripping liquid (amine solution). Therefore, it is suitable for not only an array flattening film of TFT type liquid crystal device but also several films in liquid crystal or organic EL displays, such as inter-layer insulating film, protective film, insulating film (dielectric film), uneven film provided below anti-reflective coating, and the like. Further, it is suitably used as microlens by selecting the form of the cured film.

EXAMPLES

Hereinafter, the present invention is described in further detail based on examples to which the present invention is not limited.

Abbreviations Used in Examples

The meaning of the abbreviations used in the following examples is as follows.
MM: Methacrylic acid
MMA: Methyl methacrylate
HEMA: 2-Hydroxyethyl methacrylate
CHMI: N-Cyclohexyl maleimide
NHPMA: N-Hydroxyphenyl methacryl amide
PEMA: Mono-(2-(methacryloyloxy)ethyl) phthalate
AIBN: Azobis isobutyronitrile
PGMEA: Propylene glycol monomethyl ether acetate
PGME: Propylene glycol monomethyl ether
PAG1: CGI1397 (trade name) manufactured by Ciba Specialty Chemicals
PAG2: TPS105 (trade name) manufactured by Midori Kagaku Co., Ltd.
PVE1: Tris(4-(vinyloxy)butyl)trimeritate
PVE2: Triethylene glycol divinyl ether
PVE3: 1,4-cyclohexane dimethanol divinyl ether
NCO1: VESTAGON (registered trade mark) B 1065 (trade name) manufactured by Degussa AG
NCO2: VESTAGON (registered trade mark) BF 1540 (trade name) manufactured by Degussa AG
R30: Megafak R-30 (trade name) manufactured by Dainippon Ink and Chemicals Incorporated
MEA: Monoethanol amine
GT4: GT-401 (trade name) manufactured by Daicel Chemicals Industries, Ltd.
MPTS: γ-methacryloxypropyltrimethoxysilane
P200: P-200 (trade name) manufactured by Toyo Gose Co., Ltd., a sensitizing agent synthesized by condensation of 1 mole of 4,4'-[1-[4-[1-(4-hydroxyphenyl)-1-methylethyl]phenyl]ethylidene]bisphenol with 2 mole of 1,2-naphthoquinone-2-diazide-5-sulfonyl chloride

Measurement of Number Average Molecular Weight and Weight Average Molecular Weight The number average molecular weight and weight average molecular weight of the alkali-soluble resins (specific copolymers) obtained according to Synthetic Examples mentioned below were measured under a condition in which elution solvent tetrahydrofuran was passed in a column (column temperature 40° C.) at a flow rate of 1 ml/min and thereby elution was caused by use of GPC apparatus (Shodex (registered trade mark) column KF803L and KF804L) manufactured by JASCO Corporation. In the meanwhile, the number average molecular weight (hereinafter, referred as Mn) and weight average molecular weight (hereinafter, referred as Mw) mentioned below were shown as calculated as polystyrene.

Synthesis of Specific Copolymers

Synthesis Example 1

A solution (concentration of specific copolymer: 27.5 mass %, P1) of component (A) (specific copolymer) having Mn 4,100 and Mw 7,600 was obtained by polymerizing 15.5 g of MAA, 35.3 g of CHMI, 25.5 g of HEMA and 23.7 g of MMA as monomer components constituting a specific copolymer being component (A) with 5 of AIBN as a radical polymerization initiator in 200 g of PGMEA as a solvent at a temperature of 60 to 100° C.

Synthesis Examples 2-5

The monomers and solvents indicated in each column of Synthetic Examples 2 to 5 in Table 1 were used instead of the monomer components and solvent used in Synthesis Example 1, and subjected to polymerization according to the procedure and condition similar to those of Synthesis Example 1 to obtain each solution (P2 to P6) of component (A) (specific copolymer). Then, Mn and Mw of the resulting specific copolymers were measured.

Each monomer component used in Synthesis Examples 1 to 6 and the measurement results of molecular weight are shown in Table 1.

TABLE 1

| | | Synthesis Example No. | | | | | |
|---|---|---|---|---|---|---|---|
| | | 1 | 2 | 3 | 4 | 5 | 6 |
| Specific copolymer solution | | P1 | P2 | P3 | P4 | P5 | P6 |
| Monomer | MAA (g) | 15.5 | 13.5 | | 17.5 | | 15.5 |
| | CHMI (g) | 35.3 | 11.8 | | 35.3 | | 35.7 |
| | HEMA (g) | 25.5 | 25.5 | 26.0 | 25.5 | | |
| | MMA (g) | 23.7 | 49.2 | | 21.7 | 26.0 | 49.2 |
| | NHPMA (g) | | | 41.2 | | 41.2 | |
| | PEMA (g) | | | 32.6 | | 32.6 | |
| Solvent*[1] | PGMEA (g) | 200 | 200 | | 200 | | 200 |
| | PGME (g) | | | 200 | | 200 | |
| Number average molecular weight (Mn) | | 4,100 | 4,200 | 4,800 | 4,200 | 4,800 | 4,200 |
| Weight average molecular weight (Mw) | | 7,600 | 7,300 | 9,300 | 7,300 | 8,700 | 7,500 |
| Specific copolymer concentration (mass %) | | 27.5 | 40.5 | 23.0 | 32.5 | 23.0 | 28.0 |

*[1] Solvent used for synthesizing specific copolymer

Preparation and Performance Test of Positive-Type Photosensitive Resin Composition: 1

Examples 1-10 and Comparative Examples 14

The positive-type photosensitive resin compositions of each Example and each Comparative Example were prepared by mixing in the solution of component (A), component (B), component (C), component (D) and component (E), further components (G) to (H) in a prescribed ratio according to the composition shown in Table 2 below, and stirring at room temperature for 3 hours to obtain a homogeneous solution.

Comparative Example 5

The positive-type photosensitive resin composition of Comparative Example 5 was prepared by adding in 5.5 g of the solution (P1) of the specific copolymer obtained in Synthesis Example 1 as an alkali-soluble resin solution, 1.1 g of P200 as 1,2-quinone diazide compound, 1.1 g of GT4 as epoxy crosslinkable compound, 0.0039 g of R30 as a surfactant, 0.25 g of MPTS as an adhesive auxiliary, and 25.6 g of PGMEA as a solvent, and stirring the resulting mixture at room temperature for 8 hours to obtain a homogeneous solution.

Assessment of Sensitivity

Assessment of Examples 1 to 10 and Comparative Examples 1 to 4

The positive-type photosensitive resin composition to be assessed was coated on a silicon wafer with a spin coater, and then pre-baked on a hot plate at a temperature of 120° C. for 120 seconds to form a coated film of a film thickness of 2.5 µm. The film thickness was measured by use of F20 manufactured by FILMETRICS. The resulting coated film was irradiated with UV light (5.5 mW/cm$^2$ at 365 nm) by use of UV irradiation system PLA-600FA manufactured by Canon Inc. for a prescribed time, then subjected to post exposure bake (PEB) on a hot plate at a temperature of 110° C. for 120 seconds. Thereafter, the coated film was developed by immersing it in 0.4 mass % aqueous solution of tetramethyl ammonium hydroxide (hereinafter referred as TMAH) for 60

TABLE 2

|  | Solution of component (A) (g) | Component (B) (g) | Component (C) (g) | Component (D) (g) | Component (E) (g) | Component (G) (g) | Component (H) (g) |
|---|---|---|---|---|---|---|---|
| Example 1 | P1 20.0 | PVE1 1.11 | NCO1 0.55 | PAG1 0.28 | PGMEA 2.9 | — | R30 0.0037 |
| Example 2 | P1 20.0 | PVE1 0.83 | NCO1 0.55 | PAG1 0.28 | PGMEA 2.8 | — | R30 0.0036 |
| Example 3 | P1 20.0 | PVE1 0.56 | NCO1 0.55 | PAG1 0.28 | PGMEA 1.6 | — | R30 0.0034 |
| Example 4 | P1 20.0 | PVE1 1.11 | NCO1 0.83 | PAG1 0.28 | PGMEA 3.5 | — | R30 0.0039 |
| Example 5 | P1 20.0 | PVE1 1.11 | NCO2 0.55 | PAG1 0.28 | PGMEA 2.9 | — | R30 0.0037 |
| Example 6 | P1 20.0 | PVE1 1.11 | NCO1 0.55 | PAG1 0.28 | PGMEA 2.9 | TEA 0.055 | R30 0.0038 |
| Example 7 | P1 13.6 | PVE1 1.11 | NCO1 0.55 | PAG1 0.28 | PGMEA 9.3 | — | R30 0.0037 |
| Example 8 | P3 23.9 | PVE1 1.11 | NCO1 0.55 | PAG1 0.28 | PGME/ PGMEA 0.57/3.3 | — | R30 0.0037 |
| Example 9 | P1 20.0 | PVE2 1.11 | NCO1 0.55 | PAG1 0.28 | PGMEA 2.9 | — | R30 0.0037 |
| Example 10 | P1 20.0 | PVE3 1.11 | NCO1 0.55 | PAG1 0.28 | PGMEA 2.9 | — | R30 0.0037 |
| Comparative Example 1 | P5 23.9 | PVE1 1.11 | NCO1 0.55 | PAG1 0.28 | PGME/ PGMEA 0.57/3.3 | — | R30 0.0037 |
| Comparative Example 2 | P6 19.6 | PVE1 1.11 | NCO1 0.55 | PAG1 0.28 | PGMEA 3.3 | — | R30 0.0037 |
| Comparative Example 3 | P1 20.0 | PVE1 1.11 | — | PAG1 0.28 | PGME 1.6 | — | R30 0.0034 |
| Comparative Example 4 | P1 20.0 | — | NCO1 0.55 | PAG1 0.28 | PGMEA 0.3 | — | R30 0.0032 |

As to the resulting positive-type photosensitive resin compositions of Examples 1 to 10 and Comparative Examples 1 to 5, sensitivity, film reduction (in unexposed part), light transmittance (transparency) after baking at a high temperature, light transmittance after MEA treatment, MEA resistance and dimensional accuracy were assessed according to the following procedures.

In the meanwhile, when cured films were produced from the resulting positive-type photosensitive resin compositions, for the sample of Example 5, photo-bleaching was carried out at a stage between after development and before post baking, and on the other hand, for Examples 1 to 10 and Comparative Examples 1 to 4, photo-bleaching was not carried out but post exposure bake (PEB) was carried out at a stage between after exposure to light and before development. Therefore, their assessment procedures are different from each other as follows.

seconds, and then washed with running ultrapure water for 20 seconds. The lowest exposure dose (mJ/cm$^2$) at which exposed parts dissisolved was regarded as sensitivity.

Assessment of Comparative Example 5

The positive-type photosensitive resin composition to be assessed was coated on a silicon wafer with a spin coater, and then pre-baked on a hot plate at a temperature of 120° C. for 120 seconds to form a coated film of a film thickness of 2.5 µm. The film thickness was measured by use of F20 manufactured by FILMETRICS. The resulting coated film was irradiated with UV light (5.5 mW/cm$^2$ at 365 nm) by use of UV irradiation system PLA-600FA manufactured by Canon Inc. for a prescribed time. Thereafter, the coated film was developed by immersing it in 0.4 mass % aqueous solution of TMAH for 60 seconds, and then washed with running ultrapure water for 20 seconds. The lowest exposure dose (mJ/cm²) at which exposed parts do not remain undissolved was regarded as sensitivity.

Assessment of Film Reduction

The positive-type photosensitive resin composition to be assessed was coated on a silicon wafer with a spin coater, and then pre-baked on a hot plate at a temperature of 120° C. for 120 seconds to form a coated film of a film thickness of 2.5 µm. The resulting coated film was immersed in 0.4 mass % aqueous solution of TMAH for 60 seconds, and then washed with running ultrapure water for 20 seconds. Then, level of film reduction of unexposed part by development was assessed by measuring the thickness of the film. The film thickness was measured with F20 manufactured by FILMETRICS in this assessment.

Assessment of Light Transmittance (Transparency) after Baking at High Temperature Assessment of Examples 1 to 10 and Comparative Examples 1 to 4

The positive-type photosensitive resin composition to be assessed was coated on a quartz substrate with a spin coater, and then pre-baked on a hot plate at a temperature of 120° C. for 120 seconds to form a coated film of a film thickness of 2.5 µm. The resulting coated film was immersed in 0.4 mass % aqueous solution of TMAH for 60 seconds, and then washed with running ultrapure water for 20 seconds. Then, the coated film was post baked by heating at 230° C. for 30 minutes to form a coated film of a film thickness of 1.9 µm. The resulting coated film was subjected to a measurement of transmittance at 400 nm with UV visible spectrophotometer (SIMADZU UV-2550 type manufactured by Shimadzu Corporation). Further, the transmittance at 400 nm was measured after heating the cured film at 250° C. for 30 minutes. The film thickness was measured by use of F20 manufactured by FILMETRICS.

Assessment of Comparative Example 5

The positive-type photosensitive resin composition to be assessed was coated on a quartz substrate with a spin coater, and then pre-baked on a hot plate at a temperature of 120° C. for 120 seconds to form a coated film of a film thickness of 2.4 µm. The resulting coated film was immersed in 0.4 mass % aqueous solution of TMAH for 60 seconds, and then washed with running ultrapure water for 20 seconds. The resulting coated film was irradiated with UV light (5.5 mW/cm² at 365 nm, total exposure dose: 800 mJ/cm²) by use of UV irradiation system PLA600FA manufactured by Canon Inc. (photobleaching). Then, the coated film was post baked by heating at 230° C. for 30 minutes to form a coated film of a film thickness of 1.9 µm. The resulting coated film was subjected to a measurement of transmittance at 400 nm with UV visible spectrophotometer (SIMADZU UV-2550 type manufactured by Shimadzu Corporation). Further, the transmittance at 400 nm was measured after heating the cured film at 250° C. for 30 minutes. The film thickness was measured by use of F20 manufactured by FILMETRICS.

Assessment of Light Transmittance after MEA Treatment and MEA Resistance

Assessment of Examples 1 to 10 and Comparative Examples 1 to 4

The positive-type photosensitive resin composition to be assessed was coated on a quartz substrate with a spin coater, and then pre-baked on a hot plate at a temperature of 120° C. for 120 seconds to form a coated film of a film thickness of 2.5 µm. The resulting coated film was immersed in 0.4 mass % aqueous solution of TMAH for 60 seconds, and then washed with running ultrapure water for 20 seconds. Then, the coated film was post baked by heating at 230° C. for 30 minutes to form a coated film of a film thickness of 1.9 µm. The resulting coated film was immersed in monoethanol amine heated at 60° C. for 20 minutes, and then washed with pure water for 20 seconds. Then, after drying on a hot plate at a temperature of 180° C. for 10 minutes, the coated film was subjected to a measurement of film thickness and a measurement of transmittance at 400 nm with UV visible spectrophotometer (SIMADZU UV-2550 type manufactured by Shimadzu Corporation). The film thickness was measured by use of F20 manufactured by FILMETRICS. When no change in film thickness after post baking and film thickness after MEA treatment and drying was observed, MEA resistance was regarded as good and shown in symbol "○", on the other hand, when any reduction was observed, it was regarded as no-good and shown in symbol "X".

Assessment of Comparative Example 5

The positive-type photosensitive resin composition to be assessed was coated on a quartz substrate with a spin coater, and then pre-baked on a hot plate at a temperature of 120° C. for 120 seconds to form a coated film of a film thickness of 2.4 µm. The resulting coated film was immersed in 0.4 mass % aqueous solution of TMAH for 60 seconds, and then washed with running ultrapure water for 20 seconds. The coated film was irradiated with UV light (5.5 mW/cm² at 365 nm, total exposure dose: 800 mJ/cm²) by use of UV irradiation system PLA-600FA manufactured by Canon Inc. (photobleaching). Then, the coated film was post baked by heating at 230° C. for 30 minutes to form a coated film of a film thickness of 1.9 µm. The resulting coated film was immersed in monoethanol amine heated at 60° C. for 20 minutes, and then washed with pure water for 20 seconds. Then, after drying on a hot plate at a temperature of 180° C. for 10 minutes, the coated film was subjected to a measurement of film thickness and a measurement of transmittance at 400 nm with UV visible spectrophotometer (SIMADZU UV-2550 type manufactured by Shimadzu Corporation). The film thickness was measured by use of F20 manufactured by FILMETRICS. When no change in film thickness after post baking and film thickness after MEA treatment and drying was observed, MEA resistance was regarded as good and shown in symbol "○", on the other hand, when any reduction was observed, it was regarded as no-good and shown in symbol "X".

Assessment of Dimensional Accuracy

Assessment of Examples 1 to 10 and Comparative Examples 1 to 4

The positive-type photosensitive resin composition to be assessed was coated on a silicon wafer with a spin coater, and then pre-baked on a hot plate at a temperature of 120° C. for 120 seconds to form a coated film of a film thickness of 2.5 µm. The film thickness was measured by use of F20 manufactured by FILMETRICS. The resulting coated film was irradiated with UV light (5.5 mW/cm² at 365 nm, total exposure dose: 40 mJ/cm²) by use of UV irradiation system PLA-600FA manufactured by Canon Inc. through a mask of 8 µm-line and space pattern, then subjected to post exposure bake (PEB) on a hot plate at a temperature of 110° C. for 120 seconds. Thereafter, the coated film was developed by immersing it in 0.4 mass % aqueous solution of TMAH for 60 seconds, and then washed with running ultrapure water for 20 seconds. Then, the coated film was post baked on a hot plate at 230° C. for 30 minutes. The cross-section of the formed pattern was observed by use of a scanning electron microscope (hereinafter referred as SEM), and line width was measured. The film on which pattern width was held at 8 μm was regarded as good and shown in symbol "○", on the other hand, the film on which pattern width was increased or reduced and thus was not held at 8 μm was regarded as no-good and shown in symbol "X".

Assessment of Comparative Example 5

The positive-type photosensitive resin composition to be assessed was coated on a silicon wafer with a spin coater, and then pre-baked on a hot plate at a temperature of 120° C. for 120 seconds to form a coated film of a film thickness of 2.5 μm. The film thickness was measured by use of F20 manufactured by FILMETRICS. The resulting coated film was irradiated with UV light (5.5 mW/cm$^2$ at 365 nm, total exposure dose: 200 mJ/cm$^2$) by use of UV irradiation system PLA-600FA manufactured by Canon Inc. through a mask of 8 μm-line and space pattern. Thereafter, the coated film was developed by immersing it in 0.4 mass % aqueous solution of TMAH for 60 seconds, and then washed with running ultrapure water for 20 seconds. Then, the coated film was post baked on a hot plate at 230° C. for 30 minutes. The cross-section of the formed pattern was observed by use of SEM, and line width was measured. The film on which pattern width was held at 8 μm was regarded as good and shown in symbol "○", on the other hand, the film on which pattern width was increased or reduced and thus was not held at 8 μm was regarded as no-good and shown in symbol "X".

Results of Assessments

The results of the above-mentioned assessments are shown in Table 3 below.

As can be seen from the results shown in Table 3, all of Examples 1 to 10 have a high sensitivity, occurs no film reduction in unexposed part, have little lowering of light transmittance even after baking at a high temperature of 250° C. (or 230° C.) for 30 minutes, keep a high transparency, and further have little lowering of transmittance even after MEA treatment, and have excellent MEA resistance and dimensional accuracy.

On the contrary, in Comparative Examples 1 to 3, pattern forming films were reflowed by post baking at 230° C. for 30 minutes, and thus patterns having aimed form and dimension could not be obtained. In addition, films that were not patterned occurred film reduction after post baking at 230° C. for 30 minutes followed by MEA treatment. The film thickness after MEA treatment was reduced by 25% compared with that before MEA treatment. In the meantime, "Transmittance after MEA treatment" shows a value of the film occurred film reduction after MEA treatment.

In Comparative Example 4, the film was dissolved and disappeared by development.

Further, in Comparative Example 5, film reduction in unexposed part on development was 0.2 μm. Although transmittance of the film was 91% after post baking at 230° C. for 30 minutes, transmittance of the film was lowered to 85% further by baking at 2500° C. for 30 minutes. Further, transmittance of the film was lowered from 91% to 86% by post baking at 230° C. for 30 minutes followed by MEA treatment.

Preparation and Performance Test of Positive-Type Photosensitive Resin Composition: 2

Examples 11-13 and Comparative Examples 6-9

The positive-type photosensitive resin compositions of each Example and each Comparative Example were prepared by mixing in the solution (P1, P4 and P6) of the specific copolymer obtained similarly to the above-mentioned Synthesis Examples as the solution of component (A), component (B), component (C), component (D) and component (E), further component (H) in a prescribed ratio according to the

TABLE 3

| | Sensitivity (mJ/cm$^2$) | Film reduction* (μm) | Transmittance (%) 230° C./30 min | Transmittance (%) 250° C./30 min | After MEA treatment | MEA resistance | Dimensional accuracy |
|---|---|---|---|---|---|---|---|
| Example 1 | 23 | None | 91 | 91 | 91 | ○ | ○ |
| Example 2 | 23 | None | 91 | 91 | 91 | ○ | ○ |
| Example 3 | 23 | None | 91 | 91 | 91 | ○ | ○ |
| Example 4 | 30 | None | 91 | 91 | 91 | ○ | ○ |
| Example 5 | 27 | None | 91 | 91 | 91 | ○ | ○ |
| Example 6 | 35 | None | 90 | 90 | 90 | ○ | ○ |
| Example 7 | 23 | None | 91 | 91 | 91 | ○ | ○ |
| Example 8 | 23 | None | 90 | 90 | 90 | ○ | ○ |
| Example 9 | 23 | None | 91 | 91 | 91 | ○ | ○ |
| Example 10 | 23 | None | 91 | 91 | 91 | ○ | ○ |
| Comparative Example 1 | 23 | None | 90 | 90 | 90 | X | X |
| Comparative Example 2 | 23 | None | 91 | 91 | 91 | X | X |
| Comparative Example 3 | 23 | None | 90 | 90 | 90 | X | X |
| Comparative Example 4 | 23 | Disappeared | — | — | — | X | X |
| Comparative Example 5 | 80 | 0.2 | 92 | 85 | 86 | ○ | ○ |

*1"None" indicates that no film reduction was observed from the results of measurements.

composition shown in Table 4 below, and stirring at room temperature for 3 hours to obtain a homogeneous solution.

TABLE 4

|  | Solution of component (A) (g) | Component (B) (g) | Component (C) (g) | Component (D) (g) | Component (E) (g) | Component (H) (g) |
| --- | --- | --- | --- | --- | --- | --- |
| Example 11 | P1 20.0 | PVE1 0.83 | NCO2 0.55 | PAG2 0.22 | PGMEA 17.8 | R30 0.0025 |
| Example 12 | P4 16.9 | PVE1 0.83 | NCO1 0.55 | PAG2 0.22 | PGMEA 20.9 | R30 0.0025 |
| Example 13 | P1 20.0 | PVE2 0.83 | NCO2 0.55 | PAG2 0.19 | PGMEA 18.0 | R30 0.0025 |
| Comparative Example 6 | P6 19.6 | PVE1 1.11 | NCO1 0.55 | PAG2 0.28 | PGMEA 19.8 | R30 0.0037 |
| Comparative Example 7 | P1 20.0 | PVE1 1.11 | — | PAG2 0.28 | PGMEA 14.3 | R30 0.0034 |
| Comparative Example 8 | P1 20.0 | — | NCO1 0.55 | PAG2 0.28 | PGMEA 14.3 | R30 0.0032 |
| Comparative Example 9 | P1 20.0 | — | GT4 1.1 | P200 1.1 | PGMEA 20.6 | R30 0.0039 |

As to the resulting positive-type photosensitive resin compositions of Examples 11 to 13 and Comparative Examples 6 to 9, film reduction (in unexposed part), resolution and change of film thickness after MEA treatment were assessed according to the following procedures.

Assessment of Film Reduction

The positive-type photosensitive resin composition to be assessed was coated on a silicon wafer with a spin coater, and then pre-baked on a hot plate at a temperature of 110° C. for 120 seconds to form a coated film of a film thickness of 0.5 μm. The resulting coated film was immersed in 0.4 mass % aqueous solution of TMAH for 60 seconds, and then washed with running ultrapure water for 20 seconds. Then, level of film reduction of unexposed part by development was assessed. The film thickness was measured with F20 manufactured by FILMETRICS in this assessment.

Assessment of Resolution

Assessment of Examples 1 to 10 and Comparative Examples 1 to 4

An anti-reflective coating solution for KrF (DUV-30J (trade name) manufactured by Nissan Chemical Industries, Ltd.) was coated on a silicon wafer with a spin coater, and then baked on a hot plate at a temperature of 205° C. for 60 seconds to form an anti-reflective coating of a film thickness of 140 nm. The positive-type photosensitive resin composition to be assessed was coated on the anti-reflective coating with a spin coater, and then baked on a hot plate at a temperature of 110° C. for 90 seconds to form a coated film of a film thickness of 0.5 μm. The resulting coated film was irradiated with KrF excimer laser reduction projection-type exposure system (NSR-201A manufactured by Nikon Corporation) through a mask of a line and space pattern at 10 mJ/cm², then subjected to post exposure bake (PEB) on a hot plate at a temperature of 110° C. for 90 seconds. Thereafter, the coated film was developed by immersing it in 0.4 mass % aqueous solution of TMAH for 60 seconds, and then washed with running ultrapure water for 20 seconds. Then, the coated film was post baked on a hot plate at 230° C. for 30 minutes. The cross-section of the formed pattern was observed by use of SEM, and line width was measured. The smallest pattern size at which the film was developed according to mask size without residues between patterns was regarded as resolution.

Assessment of MEA Resistance

The positive-type photosensitive resin composition to be assessed was coated on a quartz substrate with a spin coater, and then pre-baked on a hot plate at a temperature of 110° C. for 90 seconds to form a coated film of a film thickness of 0.5 μm. The resulting coated film was immersed in 0.4 mass % aqueous solution of TMAH for 60 seconds, and then washed with running ultrapure water for 20 seconds. Then, the coated film was post baked by heating at 230° C. for 30 minutes to form a coated film of a film thickness of 0.4 μm. The resulting coated film was immersed in monoethanol amine heated at 60° C. for 20 minutes, and then washed with pure water for 20 seconds. Then, after drying on a hot plate at a temperature of 180° C. for 10 minutes, the coated film was subjected to a measurement of film thickness. The film thickness was measured by use of F20 manufactured by FILMETRICS. When no change in film thickness after post baking and film thickness after MEA treatment and drying was observed, MEA resistance was regarded as good and shown in symbol "○", on the other hand, when any reduction was observed, it was regarded as no-good and shown in symbol "X".

The results of the above-mentioned assessments are shown in Table 5 below.

TABLE 5

|  | Film reduction[X] (μm) | Resolution (μm) | MEA resistance |
| --- | --- | --- | --- |
| Example 11 | None | 0.25 | ○ |
| Example 12 | None | 0.25 | ○ |
| Example 13 | None | 0.25 | ○ |
| Comparative Example 6 | None | — | X |
| Comparative Example 7 | None | — | X |
| Comparative Example 8 | Disappeared | — | X |
| Comparative Example 9 | 0.2 | — | ○ |

[X]Initial film thickness: 0.5 μm
[X]"None" indicates that no film reduction was observed from the results of measurements.

As can be seen from the results shown in Table 5, all of Examples 11 to 13 have a high resolution, occurs no film reduction in unexposed part, and have excellent MEA resistance.

On the contrary, in Comparative Examples 6 and 7, pattern forming films were reflowed by post baking at 230° C. for 30 minutes, and thus patterns having mask dimension could not be obtained. In addition, films that were not patterned occurred film reduction after post baking at 230° C. for 30 minutes followed by MEA treatment. The film thickness after MEA treatment was reduced by 25% compared with that before MEA treatment.

In Comparative Example 8, the film was dissolved and disappeared by development.

Further, in Comparative Example 9, film reduction in unexposed part on development was 0.2 μm, and the exposed part was not completely dissolved and pattern could not be formed.

Preparation and Performance Test of Positive-Type Photosensitive Resin Composition: 3

Examples 14-18

The positive-type photosensitive resin compositions of each Example were prepared by mixing in the solution (P1) of the specific copolymer obtained similarly to Synthesis Example 1 as the solution of component (A), component (B), component (C), component (D) and component (E), further component (H) in a prescribed ratio according to the composition shown in Table 6 below, and stirring at 35° C. for 3 days to obtain a homogeneous solution.

Example 19

A positive-type photosensitive resin composition was prepared by mixing in the solution (P1) of the specific copolymer obtained similarly to Synthesis Example 1 as the solution of component (A), component (B), component (C), component (D) and component (E), further component (H) in a prescribed ratio according to the composition shown in Table 6 below that is the same as that of Example 16, and stirring at 60° C. for 3 hours to obtain a homogeneous solution.

Example 20

A positive-type photosensitive resin composition was prepared by mixing in the solution (P1) of the specific copolymer obtained similarly to Synthesis Example 1 as the solution of component (A), component (B), component (C), component (D) and component (E), further component (H) in a prescribed ratio according to the composition shown in Table 6 below that is the same as that of Example 16, and stirring at 50° C. for 3 hours to obtain a homogeneous solution.

Example 21

A positive-type photosensitive resin composition was prepared by mixing in the solution (P1) of the specific copolymer obtained similarly to Synthesis Example 1 as the solution of component (A), component (B), component (C), component (D) and component (E), further component (H) in a prescribed ratio according to the composition shown in Table 6 below that is the same as that of Example 16, and stirring at 50° C. for 9 hours to obtain a homogeneous solution.

Comparative Examples 10-13

The positive-type photosensitive resin compositions of each Comparative Examples were prepared by mixing in the solution (P1, P5 and P6) of the specific copolymer obtained similarly to the above-mentioned Synthesis Examples as the solution of component (A), component (B), component (C), component (D) and component (E), further component (H) in a prescribed ratio according to the composition shown in Table 6 below, and stirring at room temperature for 3 hours to obtain a homogeneous solution.

TABLE 6

| | Solution of component (A) (g) | Component (B) (g) | Component (C) (g) | Component (D) (g) | Component (E) (g) | Component (H) (g) |
|---|---|---|---|---|---|---|
| Example 14 | P1 15 | PVE1 0.83 | NCO1 0.41 | PAG1 0.21 | PGMEA 5.75 | R30 0.0028 |
| Example 15 | P1 15 | PVE1 0.42 | NCO1 0.41 | PAG1 0.21 | PGMEA 4.07 | R30 0.0026 |
| Example 16 | P1 15 | PVE1 0.21 | NCO1 0.41 | PAG1 0.21 | PGMEA 3.23 | R30 0.0025 |
| Example 17 | P1 15 | PVE1 0.21 | NCO1 0.41 | PAG1 0.17 | PGMEA 3.1 | R30 0.0025 |
| Example 18 | P1 15 | PVE1 0.21 | NCO1 0.41 | PAG1 0.13 | PGMEA 3.0 | R30 0.0025 |
| Example 19 | P1 15 | PVE1 0.21 | NCO1 0.41 | PAG1 0.21 | PGMEA 3.23 | R30 0.0025 |
| Example 20 | P1 15 | PVE1 0.21 | NCO1 0.41 | PAG1 0.21 | PGMEA 3.23 | R30 0.0025 |
| Example 21 | P1 15 | PVE1 0.21 | NCO1 0.41 | PAG1 0.21 | PGMEA 3.23 | R30 0.0025 |
| Comparative Example 10 | P5 23.9 | PVE1 1.11 | NCO1 0.55 | PAG1 0.28 | PGME/PGMEA 0.57/3.3 | R30 0.0037 |
| Comparative Example 11 | P6 19.6 | PVE1 1.11 | NCO1 0.55 | PAG1 0.28 | PGMEA 3.3 | R30 0.0037 |
| Comparative Example 12 | P1 20 | PVE1 1.11 | — | PAG1 0.28 | PGME 1.6 | R30 0.0034 |
| Comparative Example 13 | P1 20 | — | NCO1 0.55 | PAG1 0.28 | PGMEA 0.3 | R30 0.0032 |

Comparative Example 14

The positive-type photosensitive resin composition of Comparative Example 14 was prepared by mixing 20 g of the solution (P1) of the specific copolymer obtained in Synthesis Example 1 instead of a solution of component (A), 1.1 g of P200 as 1,2-quinone diazide compound of component (C), 1.1 g of GT4 as an epoxy crosslinkable compound instead of component (B), 0.0039 g of R30 as a surfactant of component (G), 0.25 g of MPTS as an adhesive auxiliary, and 10.6 g of PGMEA as a solvent, and stirring the resulting mixture at room temperature for 8 hours to obtain a homogeneous solution.

As to the resulting positive-type photosensitive resin compositions of Examples 14 to 21 and Comparative Examples 10 to 14, sensitivity, film reduction (in unexposed part), light transmittance (transparency) after baking at a high temperature, light transmittance after MEA treatment, MEA resistance and dimensional accuracy were assessed according to the following procedures.

In the meanwhile, when cured films were produced from the resulting positive-type photosensitive resin compositions, for the sample of Comparative Example 14, photo-bleaching was carried out at a stage between after development and before post baking, and on the other hand, for Examples 14 to 21 and Comparative Examples 10 to 13, photo-bleaching was not carried out but post exposure bake (PEB) was carried out at a stage between after exposure to light and before development. Therefore, their assessment procedures are different from each other as follows.

Assessment of Sensitivity

Assessment of Examples 14 to 21 and Comparative Examples 10 to 13

The positive-type photosensitive resin composition to be assessed was coated on a silicon wafer with a spin coater, and then pre-baked on a hot plate at a temperature of 110° C. for 120 seconds to form a coated film of a film thickness of 2.5 μm. The film thickness was measured by use of F20 manufactured by FILMETRICS. The resulting coated film was irradiated with UV light (5.5 mW/cm$^2$ at 365 nm) by use of UV irradiation system PLA-600FA manufactured by Canon Inc. for a prescribed time, then subjected to post exposure bake (PEB) on a hot plate at a temperature of 110° C. for 120 seconds. Thereafter, the coated film was developed by immersing it in 0.4 mass % aqueous solution of TMAH for 60 seconds, and then washed with running ultrapure water for 20 seconds. The lowest exposure dose (mJ/cm$^2$) at which exposed parts do not remain undissolved was regarded as sensitivity.

Assessment of Comparative Example 14

The positive-type photosensitive resin composition to be assessed was coated on a silicon wafer with a spin coater, and then pre-baked on a hot plate at a temperature of 110° C. for 120 seconds to form a coated film of a film thickness of 2.5 μm. The film thickness was measured by use of F20 manufactured by FILMETRICS. The resulting coated film was irradiated with UV light (5.5 mW/cm$^2$ at 365 nm) by use of UV irradiation system PLA-600FA manufactured by Canon Inc. for a prescribed time. Thereafter, the coated film was developed by immersing it in 0.4 mass % aqueous solution of TMAH for 60 seconds, and then washed with running ultrapure water for 20 seconds. The lowest exposure dose (mJ/cm$^2$) at which exposed parts do not remain undissolved was regarded as sensitivity.

Assessment of Film Reduction

The positive-type photosensitive resin composition to be assessed was coated on a silicon wafer with a spin coater, and then pre-baked on a hot plate at a temperature of 110° C. for 120 seconds to form a coated film of a film thickness of 2.5 μm. The resulting coated film was immersed in 0.4 mass % aqueous solution of TMAH for 60 seconds, and then washed with running ultrapure water for 20 seconds. Then, level of film reduction of unexposed part by development was assessed. The film thickness was measured with F20 manufactured by FILMETRICS in this assessment.

Assessment of Light Transmittance (Transparency) after Baking at High Temperature

Assessment of Examples 14 to 21 and Comparative Examples 10 to 13

The positive-type photosensitive resin composition to be assessed was coated on a quartz substrate with a spin coater, and then pre-baked on a hot plate at a temperature of 1100° C. for 120 seconds to form a coated film of a film thickness of 2.5 μm. The resulting coated film was immersed in 0.4 mass % aqueous solution of TMAH for 60 seconds, and then washed with running ultrapure water for 20 seconds. Then, the coated film was post baked by heating at 2300° C. for 30 minutes to form a coated film of a film thickness of 1.9 μm. The resulting coated film was subjected to a measurement of transmittance at 400 nm with UV visible spectrophotometer (SIMADZU UV-2550 type manufactured by Shimadzu Corporation). Further, the transmittance at 400 nm was measured after heating the cured film at 2500° C. for 30 minutes. The film thickness was measured by use of F20 manufactured by FILMETRICS.

Assessment of Comparative Example 14

The positive-type photosensitive resin composition to be assessed was coated on a quartz substrate with a spin coater, and then pre-baked on a hot plate at a temperature of 110° C. for 120 seconds to form a coated film of a film thickness of 2.4 μm. The resulting coated film was immersed in 0.4 mass % aqueous solution of TMAH for 60 seconds, and then washed with running ultrapure water for 20 seconds. The resulting coated film was irradiated with UV light (5.5 mW/cm$^2$ at 365 nm, total exposure dose: 800 mJ/cm$^2$) by use of UV irradiation system PLA-600FA manufactured by Canon Inc. (photo-bleaching). Then, the coated film was post baked by heating at 2300° C. for 30 minutes to form a coated film of a film thickness of 1.9 μm. The resulting coated film was subjected to a measurement of transmittance at 400 nm with UV visible spectrophotometer (SIMADZU UV-2550 type manufactured by Shimadzu Corporation). Further, the transmittance at 400 nm was measured after heating the cured film at 250° C. for 30 minutes. The film thickness was measured by use of F20 manufactured by FILMETRICS.

Assessment of Light Transmittance after MEA Treatment and MEA Resistance

Assessment of Examples 14 to 21 and Comparative Examples 10 to 13

The positive-type photosensitive resin composition to be assessed was coated on a quartz substrate with a spin coater, and then pre-baked on a hot plate at a temperature of 1100° C. for 120 seconds to form a coated film of a film thickness of 2.5 µm. The resulting coated film was immersed in 0.4 mass % aqueous solution of TMAH for 60 seconds, and then washed with running ultrapure water for 20 seconds. Then, the coated film was post baked by heating at 230° C. for 30 minutes to form a coated film of a film thickness of 1.9 µm. The resulting coated film was immersed in monoethanol amine heated at 600° C. for 20 minutes, and then washed with pure water for 20 seconds. Then, after drying on a hot plate at a temperature of 1800° C. for 10 minutes, the coated film was subjected to a measurement of film thickness and a measurement of transmittance at 400 nm with UV visible spectrophotometer (SIMADZU UV-2550 type manufactured by Shimadzu Corporation). The film thickness was measured by use of F20 manufactured by FILMETRICS. When no change in film thickness after post baking and film thickness after MEA treatment and drying was observed, MEA resistance was regarded as good and shown in symbol "○", on the other hand, when any reduction was observed, it was regarded as nogood and shown in symbol "X".

Assessment of Comparative Example 14

The positive-type photosensitive resin composition to be assessed was coated on a quartz substrate with a spin coater, and then pre-baked on a hot plate at a temperature of 110° C. for 120 seconds to form a coated film of a film thickness of 2.4 µm. The resulting coated film was immersed in 0.4 mass % aqueous solution of TMAH for 60 seconds, and then washed with running ultrapure water for 20 seconds. The resulting coated film was irradiated with UV light (5.5 mW/cm² at 365 nm, total exposure dose: 800 mJ/cm²) by use of UV irradiation system PLA-600FA manufactured by Canon Inc. (photobleaching). Then, the coated film was post baked by heating at 2300° C. for 30 minutes to form a coated film of a film thickness of 1.9 µm. The resulting coated film was immersed in monoethanol amine heated at 60° C. for 20 minutes, and then washed with pure water for 20 seconds. Then, after drying on a hot plate at a temperature of 180° C. for 10 minutes, the coated film was subjected to a measurement of film thickness and a measurement of transmittance at 400 nm with UV visible spectrophotometer (SIMADZU UV-2550 type manufactured by Shimadzu Corporation). The film thickness was measured by use of F20 manufactured by FILMETRICS. When no change in film thickness after post baking and film thickness after MEA treatment and drying was observed, MEA resistance was regarded as good and shown in symbol "○", on the other hand, when any reduction was observed, it was regarded as no-good and shown in symbol "X".

Assessment of Dimensional Accuracy

Assessment of Examples 14 to 21 and Comparative Examples 10 to 13

The positive-type photosensitive resin composition to be assessed was coated on a silicon wafer with a spin coater, and then pre-baked on a hot plate at a temperature of 110° C. for 120 seconds to form a coated film of a film thickness of 2.5 µm. The film thickness was measured by use of F20 manufactured by FILMETRICS. The resulting coated film was irradiated with UV light (5.5 mW/cm² at 365 nm, total exposure dose: 40 mJ/cm²) by use of UV irradiation system PLA-600FA manufactured by Canon Inc. through a mask of 8 µm-line and space pattern, then subjected to post exposure bake (PEB) on a hot plate at a temperature of 110° C. for 120 seconds. Thereafter, the coated film was developed by immersing it in 0.4 mass % aqueous solution of TMAH for 60 seconds, and then washed with running ultrapure water for 20 seconds. Then, the coated film was post baked on a hot plate at 230° C. for 30 minutes. The cross-section of the formed pattern was observed by use of SEM, and line width was measured. The film on which pattern width was held at 8 µm was regarded as good and shown in symbol "○", on the other hand, the film on which pattern width was increased or reduced and thus was not held at 8 µm was regarded as no-good and shown in symbol "X".

Assessment of Comparative Example 14

The positive-type photosensitive resin composition to be assessed was coated on a silicon wafer with a spin coater, and then pre-baked on a hot plate at a temperature of 110° C. for 120 seconds to form a coated film of a film thickness of 2.5 µm. The film thickness was measured by use of F20 manufactured by FILMETRICS. The resulting coated film was irradiated with UV light (5.5 mW/cm² at 365 nm, total exposure dose: 200 mJ/cm²) by use of UV irradiation system PLA-600FA manufactured by Canon Inc. through a mask of 8 µm-line and space pattern. Thereafter, the coated film was developed by immersing it in 0.4 mass % aqueous solution of TMAH for 60 seconds, and then washed with running ultra-pure water for 20 seconds. Then, the coated film was post baked on a hot plate at 230° C. for 30 minutes. The cross-section of the formed pattern was observed by use of SEM, and line width was measured. The film on which pattern width was held at 8 µm was regarded as good and shown in symbol "○", on the other hand, the film on which pattern width was increased or reduced and thus was not held at 8 µm was regarded as no-good and shown in symbol "X".

Results of Assessments

The results of the above-mentioned assessments are shown in Table 7 below. In addition, in FIG. 1, a graph showing film thickness (µm, film thickness remaining undissolved in exposed part) on the irradiated dose (mJ/cm²) in Examples 15 and 16 and Comparative Example 14 (DNQ type) is shown.

TABLE 7

| | Sensitivity (mJ/cm²) | Film reduction* (µm) | Transmittance (%) | | After MEA treatment | MEA resistance | Dimensional accuracy |
|---|---|---|---|---|---|---|---|
| | | | 230° C./30 min | 250° C./30 min | | | |
| Example 14 | 18 | None | 92 | 92 | 92 | ○ | ○ |
| Example 15 | 15 | None | 87 | 88 | 88 | ○ | ○ |
| Example 16 | 9 | None | 78 | 81 | 80 | ○ | ○ |
| Example 17 | 12 | None | 78 | 81 | 80 | ○ | ○ |
| Example 18 | 13 | None | 78 | 81 | 80 | ○ | ○ |

TABLE 7-continued

| | Sensitivity (mJ/cm²) | Film reduction* (μm) | Transmittance (%) | | After MEA treatment | MEA resistance | Dimensional accuracy |
|---|---|---|---|---|---|---|---|
| | | | 230° C./30 min | 250° C./30 min | | | |
| Example 19 | 19 | None | 80 | 80 | 80 | ○ | ○ |
| Example 20 | 19 | None | 80 | 80 | 80 | ○ | ○ |
| Example 21 | 19 | None | 80 | 80 | 80 | ○ | ○ |
| Comparative Example 10 | 23 | None | 90 | 90 | 90 | X | X |
| Comparative Example 11 | 23 | None | 91 | 91 | 91 | X | X |
| Comparative Example 12 | 23 | None | 90 | 90 | 90 | X | X |
| Comparative Example 13 | 23 | Disappeared | — | — | — | X | X |
| Comparative Example 14 | 80 | 0.2 | 92 | 85 | 86 | ○ | ○ |

*"None" indicates that no film reduction was observed from the results of measurements.

As can be seen from the results shown in Table 7, all of Examples 14 to 21 have a high sensitivity, occurs no film reduction in unexposed part, have little lowering of light transmittance even after baking at a high temperature that is 250° C. (or 230° C.) for 30 minutes, keep a high transparency, and further have little lowering of transmittance even after MEA treatment, and have excellent MEA resistance and dimensional accuracy.

In addition, the results shown in FIG. 1 indicates that the sensitivity in Examples 15 and 16 are remarkably improved compared with the prior naphthoquinone diazide (DNQ) type (Comparative Example 14).

On the contrary, in Comparative Examples 10 to 12, pattern forming films were reflowed by post baking at 230° C. for 30 minutes, and thus patterns having aimed form and dimension could not be obtained. In addition, films that were not patterned occurred film reduction after post baking at 230° C. for 30 minutes followed by MEA treatment. The film thickness after MEA treatment was reduced by 25% compared with that before MEA treatment. In the meantime, "Transmittance after MEA treatment" shows a value of the film occurred film reduction after MEA treatment.

In Comparative Example 13, the film was dissolved and disappeared by development.

Further, in Comparative Example 14, film reduction in unexposed part on development was 0.2 μm. Although transmittance of the film was 92% after post baking at 230° C. for 30 minutes, transmittance of the film was lowered to 85% further by baking at 250° C. for 30 minutes. Further, transmittance of the film was lowered from 92% to 86% by post baking at 230° C. for 30 minutes followed by MEA treatment.

The positive-type photosensitive resin composition according to the present invention is very suitable as material for forming cured films such as a protecting film, a flattening film, insulating film or the like in several displays of thin film transistor (TFT) type liquid crystal display device, organic EL device, or the like, and particularly suitable as material for forming an interlayer insulating film of TFT type liquid crystal device, a protective film of color filter, an array flattening film, an uneven film provided below anti-reflective coating of reflection type display, an insulating film of organic EL device, and the like, and further suitable also as several electronic materials such as a material for microlens, and the like.

What is claimed is:
1. A method for forming a pattern comprising the steps:
coating a positive-type photosensitive resin composition on a substrate,
irradiating the coated surface with UV light through a pattern mask,
forming a pattern on the substrate by developing the coated surface, and
post-baking for film curing to the pattern-formed surface; wherein
the positive-type photosensitive resin composition comprises component (A), component (B), component (C), component (D), and component (E):
component (A): an alkali-soluble resin having a functional group which undergoes a heat crosslinking reaction with a compound of component (B), a functional group for film curing which undergoes thermoset reaction with compound of component (C), and a number average molecular weight of 2,000 to 30,000;
component (B): a compound having two or more vinyl ether groups per molecule, wherein the compound having two or more vinyl ether groups per molecule is a compound of formula (1) or formula (2):

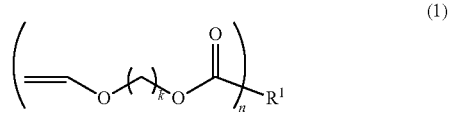

(1)

where n is a number of 2 to 10, k is a number of 1 to 10, and R¹ is an organic group of n-valence,

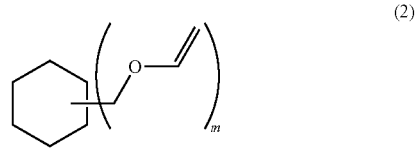

(2)

where m is a number of 2 to 10;
component (C): a compound having two or more blocked isocyanate groups per molecule, and a heat dissociation temperature of a blocked moiety of the compound is from 120 to 230° C.;
component (D): a photoacid generator; and
component (E): a solvent,
wherein
the blocked isocyanate groups in component (C) are derivatives of lactams, oximes, pyrazoles, or thiols, and the resin composition dissolves when exposed to light.

2. The method for forming a pattern according to claim 1, wherein the functional group for heat crosslinking reaction is at least one selected from the group consisting of carboxyl groups and phenolic hydroxy groups, and the functional group for film curing is at least one selected from the group consisting of hydroxy groups other than phenolic hydroxy groups, and amino groups having an active hydrogen.

3. The method for forming a pattern according to claim 1, wherein the positive-type photosensitive resin composition further comprises as component (F), other alkali-soluble resin other than component (A).

4. The method for forming a pattern according to claim 1, wherein the positive-type photosensitive resin composition contains 1 to 80 mass parts of component (B), 1 to 80 mass parts of component (C), and 0.5 to 80 mass parts of component (D), based on 100 mass parts of component (A).

5. The method for forming a pattern according to claim 4, wherein the positive-type photosensitive resin composition further comprises as component (G), an amine compound in an amount of 0.001 to 5 mass parts based on 100 mass parts of component (A).

6. The method for forming a pattern according to claim 5, wherein the positive-type photosensitive resin composition further comprises as component (F), other alkali-soluble resin other than component (A).

7. The method for forming a pattern according to claim 1, wherein the positive-type photosensitive resin composition further comprises as component (H), a surfactant in an amount of 0.2 mass % or less in the positive-type photosensitive resin composition.

8. The method for forming a pattern according to claim 5, wherein the positive-type photosensitive resin composition further comprises as component (H), a surfactant in an amount of 0.2 mass % or less in the positive-type photosensitive resin composition.

9. The method for forming a pattern according to claim 1, wherein the UV light is light having at least one wavelength of i-line, g-line, and h-line.

10. The method for forming a pattern according to claim 1, wherein the UV light is ArF, KrF, or $F_2$ laser light.

11. The method for forming a pattern according to claim 1, wherein the compound having two or more vinyl ether groups per molecule is a compound of formula (1).

12. A production process of positive-type photosensitive resin composition comprising the following component (A), component (B), component (C), component (D), and component (E):

component (A): an alkali-soluble resin having a functional group which undergoes heat crosslinking reaction with a compound of component (B), a functional group for film curing which undergoes thermoset reaction with a compound of component (C), and a number average molecular weight of 2,000 to 30,000;

component (B): a compound having two or more vinyl ether groups per molecule, wherein the compound having two or more vinyl ether groups per molecule is a compound of formula (1) or formula (2):

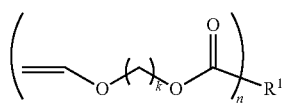
(1)

where n is a number of 2 to 10, k is a number of 1 to 10, and $R^1$ is an organic group of n-valence,

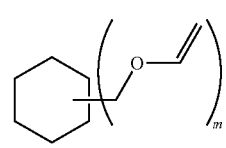
(2)

where m is a number of 2 to 10;

component (C): a compound having two or more blocked isocyanate groups per molecule, and a heat dissociation temperature of a blocked moiety of the compound is from 120 to 230° C.;

component (D): a photoacid generator; and component (E): a solvent, wherein the process comprises the steps:

mixing component (A), component (B), component (C), component (D), and component (E) to obtain a mixture solution, and advancing the crosslinking reaction to an extent by maintaining the mixture solution at a temperature higher than room temperature for a predetermined time to produce a positive-type photosensitive resin composition containing a crosslinked product of component (A) and component (B) in addition to components (A), (B), (C), and (D), wherein the blocked isocyanate groups in component (C) are derivatives of lactams, oximes, pyrazoles or thiols, and the resin composition dissolves when exposed to light.

13. The production process of positive-type photosensitive resin composition according to claim 12, wherein the mixture solution is maintained at a temperature of 30 to 70° C. for 2 hours to 5 days.

14. The production process of positive-type photosensitive resin composition according to claim 12, wherein the functional group for heat crosslinking reaction is at least one selected from the group consisting of carboxyl groups and phenolic hydroxy groups, and the functional group for film curing is at least one selected from the group consisting of hydroxy groups other than phenolic hydroxy groups, and amino groups having an active hydrogen.

15. The production process of positive-type photosensitive resin composition according to claim 12, further comprising as component (F), other alkali-soluble resin other than component (A).

16. The production process of positive-type photosensitive resin composition according to claim 12, containing 1 to 80 mass parts of component (B), 1 to 80 mass parts of component (C), and 0.5 to 80 mass parts of component (D), based on 100 mass parts of component (A).

17. The production process of positive-type photosensitive resin composition according to claim 16, further comprising as component (G), an amine compound in an amount of 0.001 to 5 mass parts based on 100 mass parts of component (A).

18. The production process of positive-type photosensitive resin composition according to claim 17, further comprising as component (F), other alkali-soluble resin other than component (A).

19. The production process of positive-type photosensitive resin composition according to claim 12, further comprising as component (H), a surfactant in an amount of 0.2 mass % or less in the positive-type photosensitive resin composition.

20. The production process of positive-type photosensitive resin composition according to claim 17, further comprising as component (H), a surfactant in an amount of 0.2 mass % or less in the positive-type photosensitive resin composition.

21. The production process of positive-type photosensitive resin composition according to claim 12, wherein the compound having two or more vinyl ether groups per molecule is a compound of formula (1).

* * * * *